(12) United States Patent
Shimoda et al.

(10) Patent No.: US 9,178,022 B2
(45) Date of Patent: Nov. 3, 2015

(54) PRECURSOR COMPOSITION AND METHOD FOR FORMING AMORPHOUS CONDUCTIVE OXIDE FILM

(75) Inventors: Tatsuya Shimoda, Nomi (JP); Jinwang Li, Kanazawa (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 177 days.

(21) Appl. No.: 13/809,993

(22) PCT Filed: Jul. 8, 2011

(86) PCT No.: PCT/JP2011/066165
§ 371 (c)(1),
(2), (4) Date: Jan. 14, 2013

(87) PCT Pub. No.: WO2012/008554
PCT Pub. Date: Jan. 19, 2012

(65) Prior Publication Data
US 2013/0112973 A1    May 9, 2013

(30) Foreign Application Priority Data

Jul. 14, 2010 (JP) ................................. 2010-159475

(51) Int. Cl.
*H01L 29/22* (2006.01)
*C01G 55/00* (2006.01)
*H01B 1/08* (2006.01)
(Continued)

(52) U.S. Cl.
CPC ............ *H01L 29/2206* (2013.01); *C01G 55/00* (2013.01); *C01G 55/002* (2013.01); *H01B 1/08* (2013.01); *H01L 29/4908* (2013.01); *C01P 2002/72* (2013.01); *C01P 2006/40* (2013.01); *H01L 21/02422* (2013.01);
(Continued)

(58) Field of Classification Search
None
See application file for complete search history.

(56) References Cited

U.S. PATENT DOCUMENTS 5,540,981 A    7/1996  Gallagher et al.
6,656,872 B2  12/2003  Labhasetwar et al.
(Continued)

FOREIGN PATENT DOCUMENTS

JP              8 2928        1/1996
JP         2000-348549 A    12/2000
(Continued)

OTHER PUBLICATIONS

U.S. Appl. No. 14/344,072, filed Mar. 11, 2014, Shimoda, et al.
Chen, C.K. et al., "The Influence of Channel Compositions on the Electrical Properties of Solution-Processed Indium—Zinc Oxide Thin-Film Transistors," Journal of Display Technology, vol. 5, No. 12, pp. 509 to 514, (2009).

(Continued)

*Primary Examiner* — Evan Pert
*Assistant Examiner* — Leslie Pilar Cruz
(74) *Attorney, Agent, or Firm* — Oblon, McClelland, Maier & Neustadt, L.L.P.

(57) ABSTRACT

The present invention provides a precursor composition for forming a conductive oxide film having high conductivity and a stable amorphous structure maintained even after heated at high temperature by a simple liquid phase process. The precursor composition of the present invention contains at least one selected from the group consisting of carboxylates, nitrates and sulfates of lanthanoids (but, except for cerium); at least one selected from the group consisting of carboxylates, nitrosyl carboxylates, nitrosyl nitrates and nitrosyl sulfates of ruthenium, iridium or rhodium; and a solvent containing at least one selected from the group consisting of carboxylic acids, alcohols and ketones.

11 Claims, 12 Drawing Sheets

(51) Int. Cl.
*H01L 29/49* (2006.01)
*H01L 29/786* (2006.01)
*H01L 21/02* (2006.01)

(52) U.S. Cl.
CPC .... *H01L 21/02565* (2013.01); *H01L 21/02592* (2013.01); *H01L 21/02628* (2013.01); *H01L 29/7869* (2013.01)

(56) References Cited

U.S. PATENT DOCUMENTS

2006/0011942 A1* 1/2006 Kim et al. ............... 257/192
2011/0169027 A1* 7/2011 Park et al. ............... 257/98

FOREIGN PATENT DOCUMENTS

| JP | 2002 47011 | 2/2002 |
| JP | 2002 321923 | 11/2002 |
| JP | 2010 13514 | 1/2010 |
| JP | 2011 228178 | 11/2011 |

OTHER PUBLICATIONS

Yabuta, H. et al, "Sputtering formation of p-type SnO thin-film transistors on glass toward oxide complimentary circuits,". Applied Physics Letters 97, 072111, American Institute of Physics, Total 4 pages, (2010).

Ogo, Y. et al., "p-channel thin-film transistor using p-type oxide semiconductor, SnO," Applied Physics Letters 93, 032113, American Institute of Physics, Total 4 pages, (2008).

International Preliminary Report on Patentability Issued Feb. 12, 2013 in PCT/JP11/66165 Filed Jul. 8, 2011.

International Search Report Issued Oct. 18, 2011 in PCT/JP11/66165 Filed Jul. 8, 2011.

Combined Chinese Office Action and Search Report issued Aug. 5, 2014 in Patent Application No. 201180034573.0 (with English translation of categories of cited documents).

Yoshihide Senzaki, et al., "Preparation of metal ruthenates by spray pyrolysis", Journal of the American Ceramic Society, vol. 78, No. 11, Nov. 1995, pp. 2977-2983.

* cited by examiner

Fig. 7
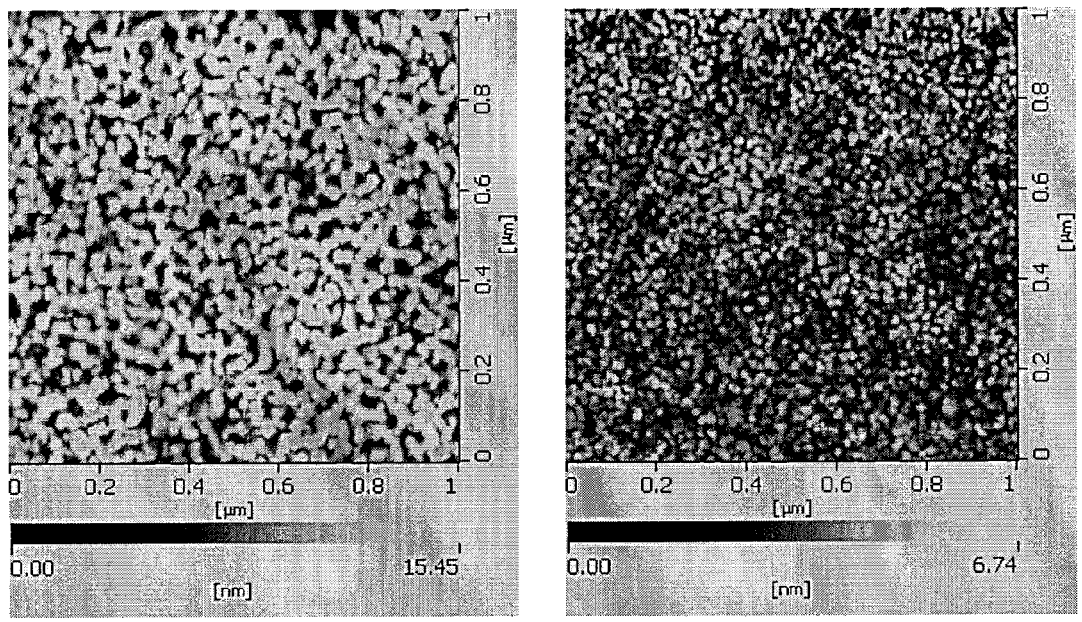
Fig. 7(a)　　　　　　　Fig. 7(b)
Fig. 8
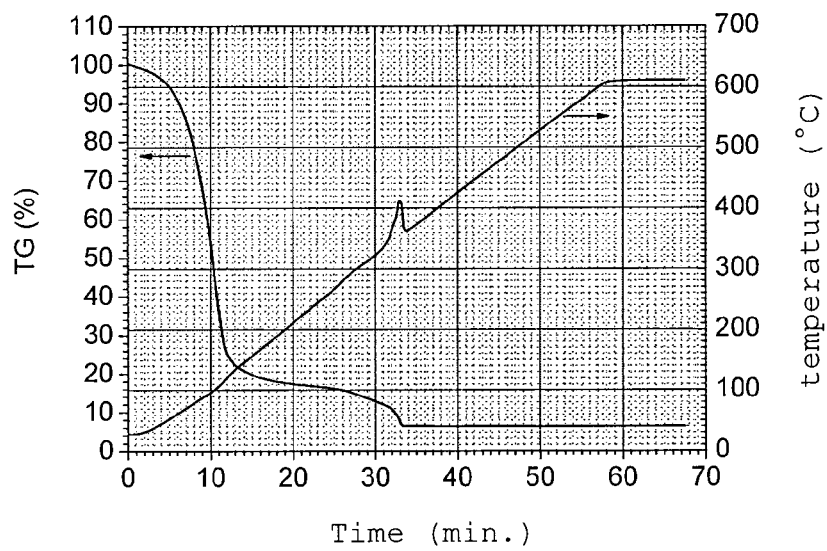

The symbol "♦" represents a peak from a $RuO_2$ crystal.

PRECURSOR COMPOSITION AND METHOD FOR FORMING AMORPHOUS CONDUCTIVE OXIDE FILM

This application is a 371 of PCT/JP11/66165, filed Jul. 8, 2011. Priority to Japanese patent application 2010-159475, filed Jul. 14, 2010, is claimed.

TECHNICAL FIELD

The present invention relates to a precursor composition and a method for forming an amorphous conductive oxide film.

BACKGROUND ART

In various electronic devices, conductive oxides are widely used as conductive materials for electrodes, wiring and the like. Recently, in the field of electronic devices, a device is required to be microminiaturized as small as possible, due to a demand of higher integration and multilayered wiring.

In this context, when a crystalline oxide is used as a conductive oxide, a limitation is indicated for the microminiaturization of the device. That is, it is known that conductivity becomes non-continuous as the size of an electrode or a wiring composed of a crystalline material approaches a crystal size. Therefore, an electrode and the like are required to have a size at least 3 times larger than that of a crystal size. Since a crystal size of a common crystalline conductive oxide is 50 to 100 nm, an electrode and the like having a size of less than 150 to 300 nm can not be produced using a crystalline conductive oxide.

On the other hand, since there are no such limitations for an amorphous conductive oxide, an electrode and the like having a more microminiature size can be formed.

As amorphous conductive oxides, for example, IZO (indium-zinc composite oxide), IGZO (indium-gallium-zinc composite oxide) and the like are known. Conventionally, films composed of these amorphous conductive oxides have been formed by gas phase methods, such as the sputtering method, the laser ablation method and the vapor deposition method, for example. However, a gas phase method requires massive and expensive equipment, and the productivity of films is also low, resulting in cost-ineffective film manufacturing.

In recent years, a technique in which an amorphous conductive oxide film is formed by a less expensive liquid phase process has been reported (C. K. Chen, et al., Journal of Display Technology, Vol. 5, No. 12, pp 509-514 (2009)). This technique involves a formation of an IZO film by applying a solution composition containing indium chloride, zinc chloride and acetonitrile as a precursor of an oxide on a substrate, and heating it. However, this technique has not yet been subjected to practical use because a film obtained by the technique do not have sufficient conductivity since its volume resistivity is greater than 1 Ω·cm. For example, in order to use the film in a gate electrode for a thin layer transistor, its volume resistivity is required to be 0.1 Ω·cm or less. In addition, the low thermal stability of amorphous IZO and IGZO is a problem. These materials can maintain an amorphous state up to 500° C. at the highest and undergo crystallization at 500 to 600° C. Therefore, they are not applicable for electronic devices which require a processing temperature of 500° C. or higher.

In view of these, a method is demanded for forming a conductive oxide film having high conductivity and a stable amorphous state by an inexpensive liquid phase process.

Recently, the present inventors completed a technique in which an amorphous conductive strontium-ruthenium composite oxide film by a liquid phase process, and filed a patent application thereof (Japanese Patent Application No. 2010-98200). The technique is an excellent technique in which an amorphous conductive oxide film having high conductivity can be formed by a liquid phase process comprising heating at a relatively low temperature of below 450° C. However, exposure of a film obtained by the technique to temperature of 450° C. or higher causes crystallization into a perovskite structure. Therefore, the stability of the amorphous structure at high temperature is not sufficient, if considering every manufacturing step of all electronic devices.

Meanwhile, a semiconductor device such as a diode and a transistor shows its functions through a junction between semiconductors showing different types of conductivity such as a pn junction and a pin junction. For many years, such a semiconductor has been manufactured using a metalloid element such as silicon and germanium. These materials are less than satisfactory as an industrial semiconductor material because their manufacturing cost is high, and they are susceptible to decomposition at high temperature of 600° C. or higher.

In this context, for example, an oxide semiconductor such as an In—Ga—Zn—O-based semiconductor is a potential material having various attractive properties including that it can also be prepared at a low temperature by a simple method such as the coating method, and that surrounding atmosphere at the time of preparation is not particularly required to be controlled, and in addition, that a thin film obtained shows optical transparency.

However, there is no other choice but to use, at least in part, conventional materials to manufacture a practical semiconductor device because most of known oxide semiconductors are an n-type semiconductor, leaving the above problems not completely solved.

Only a few oxide semiconductors showing p-type conductivity have been reported. For example, Applied Physics 97, 072111 (2010) and Applied Physics 93, 032113 (2008) described crystalline SnO showing p-type conductivity. However, the method of preparing it is very complicated. Briefly, according to the above literature in 2010, an amorphous SnO film is deposited on a substrate by radiofrequency magnetron sputtering, and a $SiO_2$ cap layer is further formed on the amorphous SnO film by sputtering. Subsequently, two step annealing at different surrounding atmospheres and temperatures was performed to obtain a crystalline SnO thin film showing p-type conductivity. Such complicated manufacturing steps lack industrial applicability. In addition to this, a crystalline SnO obtained has insufficient p-type semiconductivity.

DISCLOSURE OF THE INVENTION

The present invention is made in view of the circumstances described above. An object of the present invention is to provide a precursor composition and a method for preparing a conductive oxide film having high conductivity and a stable amorphous structure maintained even after heated at high temperature by a simple liquid phase process.

Another object of the present invention is to provide a precursor composition and a method for forming a conductive oxide film having good semiconductivity, preferably p-type conductivity by a simple liquid phase process.

Firstly, according to the present invention, the above objects and advantages of the present invention can be achieved by a composition for forming an amorphous conductive oxide film (hereinafter may be simply referred to as "a precursor composition"), the composition comprising:

at least one selected from the group consisting of carboxylates, nitrates and sulfates of lanthanoids (but, except for cerium), at least one selected from the group consisting of carboxylates, nitrosyl carboxylates, nitrosyl nitrates and nitrosyl sulfates of ruthenium, iridium or rhodium, and a solvent containing at least one selected from the group consisting of carboxylic acids, alcohols and ketones.

Secondly, the objects and advantages of the present invention can be achieved by a method of forming an amorphous conductive oxide film, the method comprising the steps of:

applying the above precursor composition on a substrate to form a coated film, and heating the coated film under an oxidizing atmosphere.

BRIEF DESCRIPTION OF DRAWINGS

FIG. 7 shows atomic force micrographs taken in Example 3. FIG. 7(a): without a chelating agent, and FIG. 7(b): with a chelating agent.

FIG. 8 shows charts of thermogravimetric analysis of the precursor composition according to the present invention (without a chelating agent) measured in Example 4.

MODE FOR CARRYING OUT THE INVENTION

Figure 1:
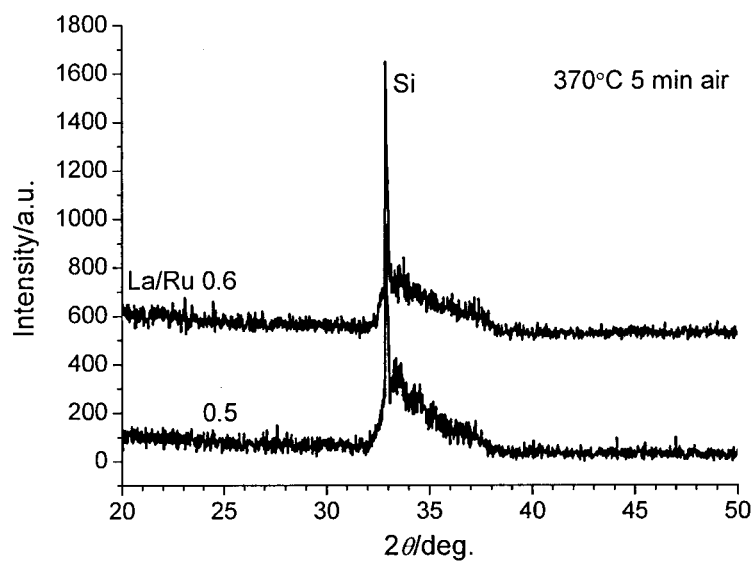
FIG. 1 shows X-ray diffraction charts after heating at 370° C. measured in Example 1.

The present invention will be described below in detail.
<A Composition for Forming an Amorphous Conductive Oxide Film>

As described above, the composition of the present invention for forming an amorphous conductive oxide film (the precursor composition) comprises:

at least one selected from the group consisting of carboxylates, nitrates and sulfates of lanthanoids (but, except for cerium), at least one selected from the group consisting of carboxylates, nitrosyl carboxylates, nitrosyl nitrates and nitrosyl sulfates of ruthenium, iridium or rhodium, and a solvent containing at least one selected from the group consisting of carboxylic acids, alcohols and ketones.

Throughout the present specification, "lanthanoids except for cerium" (the elements with atomic numbers of 57 and 59 to 71) may be simply called "lanthanoids" collectively. Throughout the present specification, a symbol "Ln" is used when the lanthanoids defined according to the above meaning are represented by a chemical formula. Moreover, ruthenium, iridium, or rhodium may be simply called "a platinum group element" collectively. Throughout the present specification, a symbol "M" is used when the platinum group elements defined according to the above meaning are represented by a chemical formula.

[Salts of Lanthanoids and Platinum Group Elements]

For the lanthanoids, any elements with atomic numbers of 57 and 59 to 71 can be suitably used. Cerium is excluded. Preferably used is at least one selected from the group consisting of lanthanum, praseodymium, neodymium, samarium, europium and gadolinium. lanthanum is more preferably used.

Carboxylates of both the lanthanoids and the platinum group elements are preferably a salt of carboxylic acid having an alkyl group having 1 to 10 carbon atoms, more preferably a salt of carboxylic acid having an alkyl group having 1 to 8 carbon atoms. For example, they can be acetate, propionate, butyrate, valerianate, 2-ethylhexanoate and the like. Among them, acetate, propionate, or 2-ethylhexanoate is preferred because they are readily available and synthesized. These carboxylates may be anhydrous salts or hydrate salts.

Both nitrates and sulfates of the lanthanoids may be anhydrous salts or hydrate salts.

Nitrosyl carboxylates of the platinum group elements are salts generally represented by the chemical formula M (NO) (OOCR)$_3$ (wherein R is an alkyl group), wherein R is preferably an alkyl group having 1 to 10 carbon atoms, more preferably an alkyl group having 1 to 8 carbon atoms. For the nitrosyl carboxylates, preferred are nitrosyl acetate, nitrosyl propionate, nitrosyl butyrate, nitrosyl valerianate, a nitrosyl 2-ethylhexanoate and the like, for example. Nitrosyl acetate is more preferred. These nitrosyl carboxylates may be anhydrous salts or hydrate salts.

Nitrosyl nitrates and nitrosyl sulfates of the platinum group elements are salts generally represented by the chemical formulas M(NO)(NO$_3$)$_3$ and M$_2$(NO)$_2$(SO$_4$)$_3$, respectively. These may be anhydrous salts or hydrate salts.

Among them, for lanthanoid salts, preferably used is at least one selected from the group consisting of carboxylates and nitrates of lanthanoids. More preferably used is at least one selected from the group consisting of lanthanum acetate, lanthanum 2-ethylhexanoate and lanthanum nitrate as well as those salts in which lanthanum in these three salts is replaced with praseodymium, neodymium, samarium, europium or gadolinium. In particular, preferably used is at least one selected from the group consisting of lanthanum acetate, lanthanum 2-ethylhexanoate and lanthanum nitrate.

For platinum group element salts, preferably used is at least one selected from the group consisting of carboxylates and nitrosyl carboxylates of platinum group elements. In particular, preferably used is at least one selected from the group consisting of ruthenium 2-ethylhexanoate, ruthenium nitrosylacetate, iridium 2-ethylhexanoate, and iridium nitrosylacetate.

A content rate of a lanthanoid salt and a platinum group element salt in the precursor composition of the present invention should be suitably selected, depending on a desired ratio of lanthanoid/platinum group element (a Ln/M ratio) in a conductive oxide film to be formed. According to the present invention, a Ln/M ratio (a mole ratio) in the composition is almost identically maintained in the film formed. Therefore, depending on a desired value of the Ln/M ratio in a film, a Ln/M ratio in the composition can be, for example, more than 0.5 (mol/mol), preferably 0.6 to 2.0 (mol/mol), more preferably 0.7 to 1.5 (mol/mol), and in particular, preferably 0.8 to 1.3 (mol/mol).

[Solvent]

A solvent included in the precursor composition of the present invention contains at least one selected from the group consisting of carboxylic acids, alcohols and ketones. In addition to these, the solvent in the present invention may contain at least one selected from the group consisting of aliphatic hydrocarbons, alicyclic hydrocarbons, aromatic hydrocarbons, esters and ethers.

For the carboxylic acids, carboxylic acids having an alkyl group having 1 to 10 carbon atoms are preferred, and carboxylic acids having an alkyl group having 2 to 8 carbon atoms are more preferred. Particular examples of these carboxylic acids can include propionic acid, n-butyric acid, isobutyric acid, n-hexanoic acid, n-octanoic acid, 2-ethylhexanoic acid and the like.

For the alcohols, primary alcohols are preferred. They can include, for example, methanol, ethanol, propanol, isopropanol, 1-butanol, sec-butanol, t-butanol, methoxymethanol, ethoxymethanol, 2-methoxyethanol, 2-ethoxyethanol and the like.

For the ketones, ketones having 3 to 10 carbon atoms are preferred, and ketones having 4 to 7 carbon atoms are more preferred. Note that the number of carbon atoms is a number including a carbon atom of the carbonyl group. Particular examples of those ketones can include, for example, methyl ethyl ketone, methyl isobutyl ketone, diethyl ketone and the like.

Furthermore, the aliphatic hydrocarbons can include, for example, hexane, octane and the like. The alicyclic hydrocarbons can include, for example, cyclohexane and the like. The aromatic hydrocarbons can include, for example, benzene, toluene, xylene and the like. The esters can include, for example, methyl acetate, ethyl acetate, methyl propionate, ethyl propionate, methyl butyrate, ethyl acetate, methyl 2-ethylhexanoate, ethyl 2-ethylhexanoate and the like. The ethers include, for example, diethyl ether, dibutyl ether, ethylene glycol dimethyl ether, ethylene glycol diethyl ether, ethylene glycol ethyl methyl ether, tetrahydrofuran, tetrahydropyran, dioxane and the like.

The solvent in the present invention contains at least one selected from the group consisting of carboxylic acids, alcohols and ketones. A content rate of one selected from the group consisting of carboxylic acids, alcohols and ketones in the solvent in the present invention is preferably 50% or more by weight, more preferably 75% or more by weight based on the total amount of the solvent from the viewpoint of solubility and long term stability of the composition.

In order to use the precursor composition of the present invention for a semiconductor device, a non-aqueous solvent essentially free of water is preferred. The phase "essentially free of water" as used herein does not mean that the presence of trace water as an impurity contained in a hydrophilic solvent shall not be permitted, but encompasses a case in which a water content in the solvent is decreased as much as possible by those efforts routinely made in industry by a person skilled in the art. For the water content rate in the solvent, for example, 1% or less by weight is preferred, and 0.1% or less by weight is more preferred.

[Other Components]

The precursor composition of the present invention contains a lanthanoid salt, a platinum group element salt and a solvent as described above as essential components, but other components may be included as long as they do not interfere with the effects of the present invention. The other components can include, for example, a chelating agent.

The chelating agent can be included in the precursor composition of the present invention in order to improve the surface smoothness of a film to be formed. The mechanism by which a chelating agent improves the surface smoothness of a film is not clearly understood, and the present inventors speculate as follows. That is, a chelating agent may coordinate in a lanthanoid salt and a platinum group element salt in a chelating fashion to stabilize the salts, and delay a decomposition process of the salts in a heating step of the film formation as described below. This may cause a core of the salt pyrolysis to become fine and uniform, resulting in a smoothed surface of the film.

Chelating agents having those functions described above can include, for example, compounds having two or more of at least one selected from the group consisting of an amino group and a hydroxyl group. For specific examples of the chelating agents, compounds having two or more amino groups can include, for example, ethylenediamine, polyethyleneamine and the like. Compounds having two or more hydroxyl groups can include, for example, ethylene glycol, glycerol and the like. Compounds having both an amino group and a hydroxyl group can include, for example, monoethanolamine and the like. At least one selected from the above compounds can be preferably used.

In the case that the precursor composition of the present invention contains a chelating agent, the content rate of the chelating agent is preferably 3 mol or more, and more preferably 5 to 20 mol based on the total 1 mol of lanthanoid atoms and platinum group element atoms in the composition.

[A Composition for Forming an Amorphous Conductive Oxide Film]

The composition for forming an amorphous conductive oxide film (the precursor composition) of the present invention can be prepared by mixing and dissolving, in a solvent described above, each of the components other than that solvent. In this step, the solvent and each of the components may be mixed and dissolved simultaneously, or each component may be added sequentially, or each component may be dissolved separately in the solvent to mix the resulting two or more solutions. Alternatively, other suitable methods may be used. When the precursor composition of the present invention is prepared, heat may be applied if appropriate.

The precursor composition of the present invention preferably has its pH in an acidic region. A value of pH of the composition is preferably 6.5 or less, and in particular preferably pH 3 to 6. Having such pH allows the precursor composition to have excellent storage stability.

The solid content concentration of the precursor composition of the present invention (a rate of the total weight of a lanthanoid salt and a platinum group element salt in the composition based on the total weight of the whole composition) is preferably 0.1 to 10% by weight, and more preferably 0.5 to 6% by weight.

The composition prepared may be filtered through a filter having a suitable pore size before use.

As mentioned above, each of the lanthanoid salt and the platinum group element salt as a component of the precursor composition of the present invention may be a hydrate salt. Therefore, the precursor composition of the present invention may contain water immediately after its preparation. In addition, the solvent contains at least one selected from the group consisting of carboxylic acids, alcohols and ketones, which are hydrophilic. Therefore, the composition may absorb moisture during use or storage. However, the precursor composition of the present invention can be stored for long time, even if the water content in the composition is not controlled. Therefore, the precursor composition of the present invention can be used to form a highly conductive oxide film by a simple method as described below, with a greatly reduced preparation cost and storage cost, contributing to a decreased manufacturing cost of electronic devices.

However, in order to use the precursor composition of the present invention in a semiconductor device, a composition essentially free of water is preferred. As used herein, the phrase "essentially free of water" does not mean that the presence of trace water as an impurity contained in a hydrophilic raw material and the like, and the presence of water as crystal water shall not be permitted, but encompasses a case in which a water content in the composition is decreased as much as possible by those efforts routinely made in industry by a person skilled in the art. The water content rate in the composition is, for example, preferably 5% or less by weight, more preferably 1% or less by weight, and in particular preferably 0.5% or less by weight.

<A Method of Forming an Amorphous Conductive Oxide Film>

A method of forming an amorphous conductive oxide film of the present invention comprises applying the composition for forming an amorphous conductive oxide film as described above (the precursor composition) on a substrate to form a coated film, and heating the coated film under an oxidizing atmosphere.

For the substrates used in the method of the present invention, substrates composed of a following substance, without particular limitation, for example, quartz; glass such as borosilicate glass, soda glass, quartz glass; plastics; carbon; silicone resin; silicon; a metal such as gold, silver, copper, nickel, titanium, aluminium, tungsten; glass, plastics or silicon having a metal, an oxide thereof, a composite oxide thereof (for example, ITO and the like), or a silicon oxide on the surface.

In order to apply the precursor composition on a substrate, a suitable coating method can be used, including, for example, the spin coating method, the roll coating method, the curtain coating method, the dip coating method, the spray method, the droplet discharge method and the like. Subsequently, a coated film can be formed on the substrate by removing a solvent from the liquid coating composed of the precursor composition if needed. Residual solvent left in the coated film at this time will not diminish the effects of the present invention. Removal of the solvent after coating can be achieved, for example, by allowing the substrate to stand for about 1 to 30 minutes at between room temperature and 450° C.

The coated film formed in this way is then heated under an oxidizing atmosphere.

Heating under an oxidizing atmosphere can be preferably achieved by performing a heating operation under an oxygen-containing gas. As the oxygen-containing gas, air, oxygen and the like are preferably used. The gas can be at any pressure when heating, and can be heated, for example, at $5\times10^4$ to $1\times10^6$ Pa.

A heating temperature is preferably 370° C. or higher, more preferably 400° C. or higher, and even more preferably 500° C. or higher because appropriate conductivity will be conferred. The conductive oxide film obtained by the method of the present invention will not undergo crystallization or will show high resistance to crystallization even at a high heating temperature. Therefore, a fine conductive film of any sizes can be formed independently of a heating temperature and without limited by a crystal size. However, because it may slightly undergo crystallization when a Ln/M ratio in the film is small, the upper limit of the heating temperature is preferably selected depending on the Ln/M ratio to avoid the crystallization. For example, when a Ln/M ratio in the film is 0.9 to 2.0 (mol/mol) (in other words, when a Ln/M ratio in the composition is 0.9 to 2.0 (mol/mol)), a heating temperature of 750° C. does not cause crystallization. When a Ln/M ratio in the film is 0.8 or more (mol/mol) and less than 0.9 (mol/mol), a heating temperature of 700° C. does not cause crystallization. When a Ln/M ratio in the film is 0.6 or more (mol/mol) and less than 0.8 (mol/mol), a heating temperature of 650° C. does not cause crystallization. Therefore, a heating temperature is preferably equal to or less than these temperatures depending on the Ln/M ratio.

Heating time is preferably 3 minutes or longer, and more preferably 10 minutes or longer. According to the present invention, an oxide film having sufficiently high conductivity can be formed by heating at the above temperature for the above time period. Therefore, there is no practical benefit gained from prolonged heating. However, prolonged heating is not necessarily forbidden since the conductive oxide film formed will not undergo crystallization by further heating as long as heat is applied within the above temperature range. Nonetheless, a heating time of Z hours or less is preferred in terms of senseful cost.

Steps of applying the precursor composition, optionally removing a solvent and heating as described above may be performed once (one cycle) or may be repeated more than once, i.e. in a recoating fashion to form a conductive oxide film.

A thickness of the amorphous conductive oxide film formed in this way should be suitably selected according to an application purpose, but it can be 20 to 500 nm, for example.

[A Method of Forming a Patterned Amorphous Conductive Oxide Film]

A patterned amorphous conductive oxide film can be formed by the method of forming an amorphous conductive oxide film as described above, the method comprising the steps of: applying the precursor composition of the present invention on a substrate to form a coated film, and then placing a patterned mold on the coated film such that the coated film is sandwiched between the substrate and the patterned mold, and subsequently heating the coated film under an oxidizing atmosphere.

In other words, the above method of forming a patterned conductive oxide film comprises the steps of: applying the precursor composition of the present invention on a substrate to form a coated film, placing a patterned mold on the coated film such that the coated film is sandwiched between the substrate and the patterned mold, and heating the coated film under an oxidizing atmosphere. In the present specification, the above method of forming a patterned film may be referred to as "the nanoimprint method."

A substrate used, a method of applying the precursor composition on the substrate and a thickness of a coated film formed are the same as in the method of forming an amorphous conductive oxide film as described above, respectively.

For a patterned mold used for the method of forming a patterned conductive oxide film of the present invention, those composed of the same materials as described above as a material of a substrate can be used. Among them, silicon, quartz, silicon with an oxide film, silicone resin (for example, polydimethylsiloxane (PDMS) and the like), metals (for example, nickel and the like) and the like are preferred because they have good workability to allow a fine pattern to be formed, and the patterned oxide films formed have good mold releasability and the like.

Patterns for the patterned mold can include, for example, a line and space pattern, a cylindrical or polygonal pillar pattern (for example, square pillar), a cone or polygonal pyramid pattern (for example, quadrangular pyramid), or a protrusion or a pore formed by cutting them at a plane, or combinations thereof. The pattern also can be a mirror finished surface.

According to the method of forming a patterned amorphous conductive oxide film of the present invention, any fine pattern of the patterned mold, which is a parent pattern, can be preferably transferred to a film to form a patterned film. A patterned conductive oxide film having an aspect ratio of, for example, 5 or less, preferably 3 or less, can be transferred with a width of, for example, 10 nm or more, preferably 50 nm or more. Note that the aspect ratio here means a value of the height of the line divided by the width in the case of the line and space pattern, a value of the height of the protrusion divided by the diameter or the length of a side of the protrusion in the case of the protrusion and a value of the depth of the pore divided by the diameter or the length of a side of the pore in the case of the pore, respectively.

A coated film can be sandwiched between a substrate and a patterned mold by forming the coated film on the substrate as described above, and then placing and, if appropriate, pressing the patterned mold against the coated film. Here a pressure at which a patterned mold is pressed against the coated film is preferably 0.1 to 10 MPa.

When a patterned mold is placed on a coated film, at least one of the substrate and the patterned mold is preferably pre-treated with a mold releasing treatment. Mold releasing agents which can be used in this context can include, for example, surfactants (for example, fluorine surfactants, silicone surfactants, non-ionic surfactants and the like), fluorine-containing diamond-like carbon (F-DLC) and the like.

A coated film may be heated with the coated film being sandwiched at the gap between a substrate and a patterned mold, or after removing the patterned mold on the coated film.

Heating temperature, heating time and oxidizing atmosphere are the same as in the method of forming an amorphous conductive oxide film. Note that even when heating is performed with a coated film being sandwiched at the gap between a substrate and a patterned mold, an oxide film having sufficiently high conductivity can be formed as long as its surrounding atmosphere is an oxidizing atmosphere.

<An Amorphous Conductive Oxide Film>

An amorphous conductive oxide film or a patterned amorphous conductive oxide film can be formed as described above.

The amorphous conductive oxide film (including those patterned) formed according to the method of the present invention has high conductivity. By selecting a suitable Ln/M ratio and heating temperature, its volume resistivity of 1.0 $\Omega \cdot cm$ or less, preferably 0.5 $\Omega \cdot cm$ or less, more preferably 0.1 $\Omega \cdot cm$ or less, and in particularly 0.05 $\Omega \cdot cm$ or less can be achieved.

Furthermore, the amorphous conductive oxide film (including those patterned) formed according to the method of the present invention will not undergo crystallization even when heated at high temperature. Therefore, a fine electrode, wiring and the like without limited by a crystal size can be easily formed independently of a heating temperature during a manufacturing process of electronic devices. Therefore, the amorphous conductive oxide film formed according to the method of the present invention can be suitably used for various electronic devices, and can be used as, for example, a material for a gate electrode in a thin layer transistor.

EXAMPLES

In the following Examples, various measurements were performed under the following conditions.

[Conditions for X Ray Diffraction Measurements]
Measurement instrument: "M18 XHF-SRA" from MacScience.
Radiation source: Cu K$\alpha$ emission
Sample size: 1 cm×2 cm
Voltage and current: 40 kV, 60 mA
Measurement range: 2$\theta$=10 to 50°
Scan speed: 5°/min.

[Volume Resistivity]
Volume resistivity was measured by the four probe method.

[Atomic Force Microscopy]
Atomic force microscopic measurements and determination of root-mean-square roughness (RMS) were performed with a scanning frequency of 1 Hz on a SII SPM Nano Navi Station equipped with a S-image unit and a SN-AF01 S-NT cantilever.

<Preparation of a Composition for Forming a Conductive Oxide Film>

In the following Preparation Examples, a commercial product from Rare Earth Products, Inc. (an anhydrous salt, Purity: 99% by weight) for lanthanum 2-ethylhexanoate; and a commercial product from ADEKA Corporation (an anhydrous salt, the Ru content=17.73% by weight) for ruthenium 2-ethylhexanoate were used, respectively.

[Preparation of a Solution of Lanthanum Carboxylate]
To a 30 mL glass bottle with a lid, 3.980 g of lanthanum 2-ethylhexanoate was placed, and 16.02 g of propionic acid was added and dissolved at room temperature to give a solution with a La concentration of 0.35 mol/kg.

[Preparation of a Solution of Ruthenium Carboxylate]
To a 30 mL glass bottle with a lid, 3.99 g of ruthenium 2-ethylhexanoate was placed, and 16.01 g of methyl isobutyl ketone was added and dissolved at room temperature to give a solution with a Ru concentration of 0.35 mol/kg.

[Preparation of Compositions for Forming a Conductive Oxide Film]

Preparation Example 1

In a 13.5 mL glass bottle, 2 g of the ruthenium 2-ethylhexanoate solution, and 1 g of the lanthanum 2-ethylhexanoate solution were mixed to prepare a composition with a La/Ru ratio of 0.5 (mol/mol).

Preparation Examples 2 to 6

Compositions having La/Ru ratios of 0.6, 0.7, 0.8, 0.9 and 1.0 (mol/mol) were prepared in the same way as in Preparation Example 1 except that the amount of the lanthanum 2-ethylhexanoate solution to be mixed with 2 g of the ruthenium 2-ethylhexanoate solution was 1.2 g (Preparation Example 2), 1.4 g (Preparation Example 3), 1.6 g (Preparation Example 4), 1.8 g (Preparation Example 5) and 2.0 g (Preparation Example 6), respectively.

Preparation Example 7

Into a 13.5 mL glass bottle, charged was 1 g of the composition with a La/Ru ratio of 0.9 (mol/mol) obtained above from Preparation Example 5. To this, 0.30 g of monoethanolamine was then added dropwise, and precipitates were observed. The mixture was heated in the glass bottle on a hot plate for 40 minutes at 150° C. to obtain a dark brown solution.

By allowing the solution to cool down to room temperature, and then diluting the resulting viscous solution with 1.30 g of 1-butanol, prepared was a composition with a La/Ru ratio of 0.9 (mol/mol) containing monoethanolamine as a chelating agent.

Formation and Evaluation of Conductive Oxide Films

Example 1

In this Example, the effects of La/Ru ratios and heating temperatures on the crystallinity of the oxides obtained were investigated.
(1) In the Case of La/Ru=0.5 (Mol/Mol)

The composition with La/Ru=0.5 (mol/mol) obtained above from Preparation Example 1 was spin coated on a 20 mm×20 mm silicon substrate having an oxide film on the surface at 2,000 rpm for 25 seconds. After that, heat was applied in air on a 150° C. hot plate for 6 seconds and on a 250° C. hot plate for 5 minutes, and heat was then applied at 370° C. for 5 minutes to obtain an oxide film with a thickness of about 60 nm.

X ray diffraction measurements of the oxide film obtained here revealed that the film was amorphous.

An X ray diffraction chart measured here (2θ=20 to 50°) are shown in FIG. 1.

The oxide film after the X ray diffraction measurements was further subjected to additional heating at 500° C. for 30 minutes under oxygen flow at a flow rate of 0.2 L (STP)/minute. Then X ray diffraction was measured again.

The oxide film after this X ray diffraction measurement was sequentially heated at the following heating temperatures and heating durations under oxygen flow as described above: at 550° C. for 30 minutes; at 600° C. for 10 minutes; at 650° C. for 10 minutes; at 700° C. for 10 minutes; at 750° C. for 10 minutes; and at 800° C. for 10 minutes. After heating at each temperature, X ray diffraction was measured for each.

Figure 2:
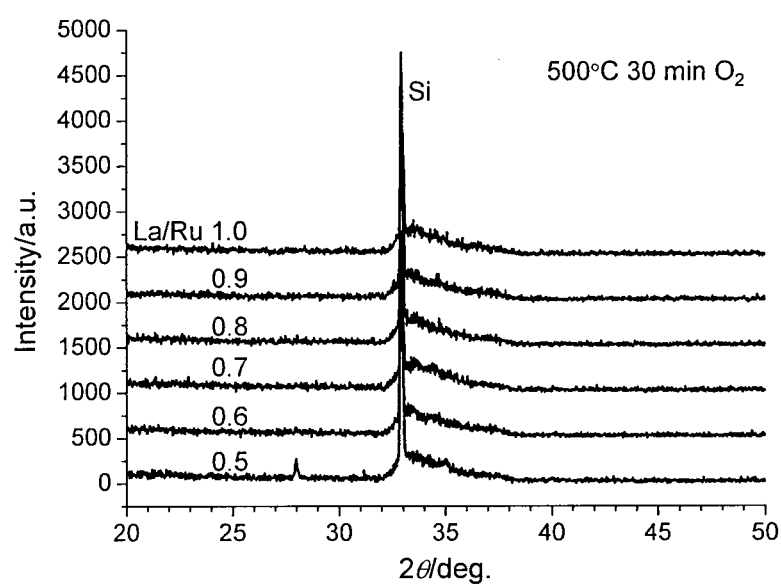
FIG. 2 shows X-ray diffraction charts after additional heating at 500° C. measured in Example 1.
Figure 3:
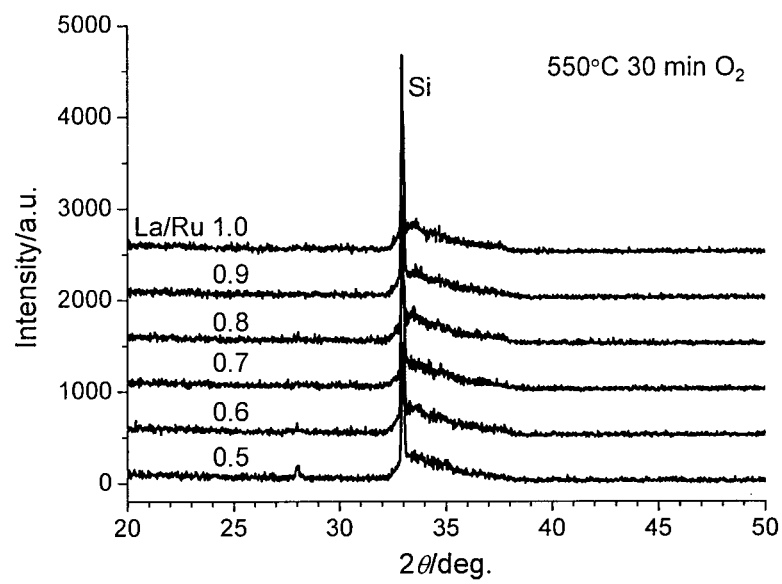
FIG. 3 shows X-ray diffraction charts after additional heating at 550° C. measured in Example 1.
Figure 4:
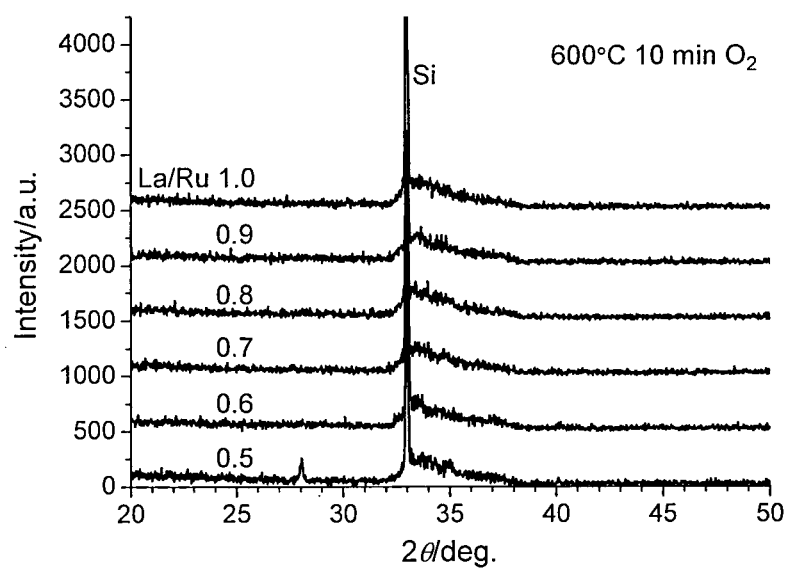
FIG. 4 shows X-ray diffraction charts after additional heating at 600° C. measured in Example 1.
Figure 5:
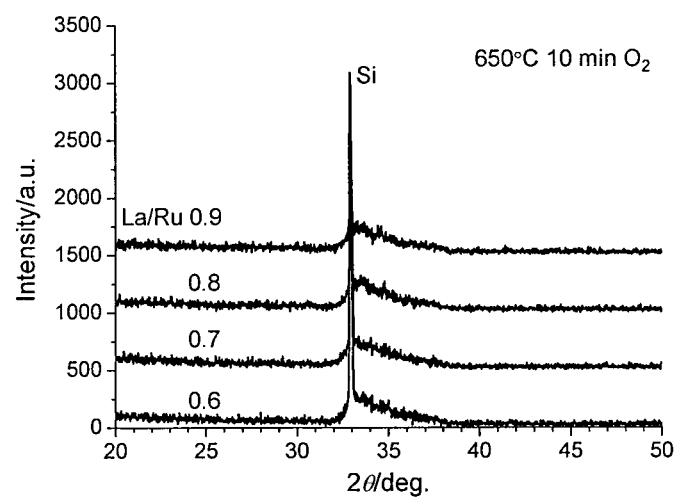
FIG. 5 shows X-ray diffraction charts after additional heating at 650° C. measured in Example 1.
Figure 6:
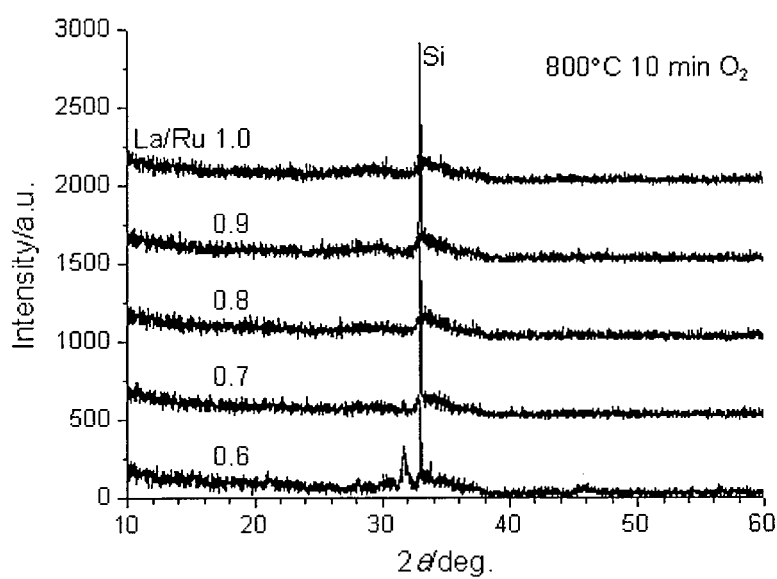
FIG. 6 shows X-ray diffraction charts after additional heating at 800° C. measured in Example 1.

Here, X ray diffraction charts measured after heating at 500° C., 550° C. and 600° C. are shown in FIGS. 2 to 4, respectively.
(2) In the Case of La/Ru=0.6 (Mol/Mol)

X ray diffraction was measured after heating at 370° C. and after additional heating at each temperature under oxygen flow in the same way as in (1) above except that the composition with La/Ru=0.6 (mol/mol) obtained above from Preparation Example 2 was used as a composition.

X ray diffraction charts measured here are shown in FIGS. 1 to 6.
(3) In the Case of La/Ru=0.7 to 1.0 (Mol/Mol)

Each of oxide films was obtained on a substrate in the same way as in (1) above except that the compositions with La/Ru=0.7, 0.8, 0.9 and 1.0 (mol/mol) obtained above from Preparation Examples 3 to 6 were used as a composition, respectively.

For each oxide film obtained, a cycle of additional heating under oxygen flow at each temperature and X ray diffraction measurements were repeated in the same way as in (1) above.

Here, X ray diffraction charts measured after heating at 500° C., 550° C., 600° C., 650° C. and 800° C. are shown in FIGS. 2 to 6, respectively.

The results from the above are following: for a heating temperature of 370° C., the oxides obtained were found to be amorphous in the case of La/Ru=0.5 and 0.6 (mol/mol). For a heating temperature between 500 and 600° C., the oxides obtained were found to be all amorphous in the case of La/Ru=0.6 to 1.0 (mol/mol) while a little crystallinity was observed in the case of La/Ru=0.5 (mol/mol). In addition, for a heating temperature of 650° C., the oxides obtained were found to be all amorphous in the case of La/Ru=0.6 to 1.0 (mol/mol). For a heating temperature of 800° C., the oxides obtained were found to be all amorphous in the case of La/Ru=0.7 to 1.0 (mol/mol) while a little crystallinity was observed in the case of La/Ru=0.6 (mol/mol).

These results indicate that crystallinity of the obtained oxides decreases as a La/Ru ratio increases, and that an amorphous state is stably maintained up to at least 650° C. in the case of La/Ru=0.6 (mol/mol) or more, and that an amorphous state is stably maintained up to at least 800° C. in the case of La/Ru=0.7 (mol/mol) or more.

Example 2

In this Example, the effects of La/Ru ratios and heating temperatures on the volume resistivity of the obtained oxides were investigated.
(1) In the Case of La/Ru=0.6 (Mol/Mol)

The composition with La/Ru=0.6 (mol/mol) obtained above from Preparation Example 2 was spin coated on a 20 mm×20 mm silicon substrate having an oxide film on the surface at 2,000 rpm for 25 seconds. After that, heat was applied in air on a 150° C. hot plate for 6 seconds and then on a 250° C. hot plate for 5 minutes, and heat was then applied at 370° C. for 5 minutes to obtain an oxide film with a thickness of about 60 nm. By repeating total four cycles of spin coating and heating to recoat a coated film on the substrate, an oxide film having a thickness of 240 nm was obtained on the substrate.

Volume resistivity was measured for the oxide film.

After this measurement of volume resistivity, the oxide film was further subjected to additional heating at 500° C. for 30 minutes under oxygen flow at a flow rate of 0.2 L (STP)/minute. Then volume resistivity was measured again.

Subsequently, the oxide film after the above measurement of volume resistivity was subjected to sequential additional heating at the following heating temperatures and durations as described above: at 550° C. for 30 minutes; at 600° C. for 10 minutes; at 650° C. for 10 minutes; at 700° C. for 10 minutes; at 750° C. for 10 minutes; and at 800° C. for 10 minutes. After heating at each temperature, volume resistivity was measured for each.

Values of volume resistivity measured above are each shown in Table 1.
(2) In the Case of La/Ru=0.7 to 1.0 (Mol/Mol)

Each of oxide films with a thickness of 240 nm was obtained on a substrate in the same way as in (1) above except that the compositions with La/Ru=0.7, 0.8, 0.9 and 1.0 (mol/ mol) obtained above from Preparation Examples 3 to 6 were used respectively as a composition. Volume resistivity was measured for each.

For each of the oxide films after this measurement of volume resistivity, a cycle of additional heating under oxygen flow at each temperature and a measurement of volume resistivity were repeated in the same way as in (1) above.

Values of volume resistivity measured above are each shown in Table 1.

TABLE 1

Volume resistivity of conductive oxide films ($\Omega \cdot cm$)

| Heating temperature | La/Ru (mole ratio) | | | | |
|---|---|---|---|---|---|
| | 0.6 | 0.7 | 0.8 | 0.9 | 1.0 |
| 370° C. | 0.0074 | 0.0074 | 0.011 | 0.013 | 0.018 |
| 500° C. | 0.053 | 0.029 | 0.024 | 0.026 | 0.036 |
| 550° C. | 0.14 | 0.067 | 0.043 | 0.043 | 0.067 |
| 600° C. | 0.31 | 0.12 | 0.065 | 0.062 | 0.098 |
| 650° C. | 0.72 | 0.22 | 0.11 | 0.094 | 0.15 |
| 700° C. | 5.8 | 1.1 | 0.36 | 0.29 | 0.38 |
| 750° C. | 101 | 6.7 | 1.0 | 0.62 | 0.67 |
| 800° C. | overload | 101 | 11 | 3.1 | 2.6 |

As shown in Table 1, the followings were found. The conductivity tends to be higher as a La/Ru ratio increases and a heating temperature decreases. High conductivity with a volume resistivity of less than 1.0 $\Omega \cdot cm$ was obtained: a heating temperature of at least up to 650° C. in the case of La/Ru=0.6 (mol/mol) or more; a heating temperature of at least up to 700° C. in the case of La/Ru=0.8 (mol/mol) or more; and a heating temperature of at least up to 750° C. in the case of La/Ru=0.9 (mol/mol) or more. Furthermore, very high conductivity with a volume resistivity of less than 0.1 $\Omega \cdot cm$ was obtained; a heating temperature of at least up to 500° C. in the case of La/Ru=0.6 (mol/mol) or more; a heating temperature of at least up to 550° C. in the case of La/Ru=0.7 (mol/mol) or more; and a heating temperature of at least up to 600° C. in the case of La/Ru=0.8 (mol/mol) or more.

Example 3

In this Example, the effects of a chelating agent (monoethanolamine) on the surface smoothness and volume resistivity of the oxide films obtained were investigated.

(1) In the Case of a Composition Containing No Chelating Agent

The composition with La/Ru=0.9 (mol/mol) containing no chelating agent obtained above from Preparation Example 5 was spin coated on a 20 mm×20 mm silicon substrate having an oxide film on the surface at 2,000 rpm for 25 seconds. After that, heat was applied in air on a 150° C. hot plate for 6 seconds and then on a 250° C. hot plate for 5 minutes, and heat was then applied at 370° C. for 5 minutes to obtain an oxide film with a thickness of about 60 nm. By repeating total four cycles of spin coating and heating to recoat a coated film on the substrate, an oxide film having a thickness of 240 nm was obtained on the substrate.

Volume resistivity was measured for the oxide film.

The oxide film after this measurement of volume resistivity was further subjected to additional heating at 500° C. for 30 minutes under oxygen flow at a flow rate of 0.2 L (STP)/minute. Then volume resistivity was measured again.

Values of volume resistivity measured above are each shown in Table 2.

(2) In the Case of a Composition Containing a Chelating Agent

An oxide film with a thickness of about 100 nm was obtained on a substrate in the same way as in (1) above except that the composition with a La/Ru ratio of 0.9 (mol/mol) containing a chelating agent obtained above from preparation example 7 was used, and a cycle of spin coating and heating was repeated three times. After heating at 370° C. and after additional heating at 500° C., volume resistivity was measured for each.

Values of volume resistivity measured above are each shown in Table 2.

(3) Evaluation of the Surface Roughness of the Oxide Films

For each of the oxide films after additional heating at 500° C. obtained from (1) and (2) above, atomic force microscopic measurements were performed to examine root-mean-square roughness (RMS).

Atomic force micrographs taken here are shown in FIGS. 7(*a*) and (*b*), respectively. FIG. 7(*a*) corresponds to (1) the absence of a chelating agent (RMS=2.6 nm), and FIG. 7(*b*) corresponds to (2) the presence of a chelating agent (RMS=0.9 nm).

TABLE 2

Volume resistivity of conductive oxide films ($\Omega \cdot cm$)

| Heating temperature | Without a chelating agent | With a chelating agent |
|---|---|---|
| 370° C. | 0.013 | 0.013 |
| 500° C. | 0.026 | 0.027 |

These results show that surface smoothness is improved without sacrificing conductivity when the composition for forming a conductive oxide film of the present invention contains a chelating agent.

Example 4

In this Example, pyrolysis behavior was investigated for the composition for forming a conductive oxide film of the present invention.

Figure 9:
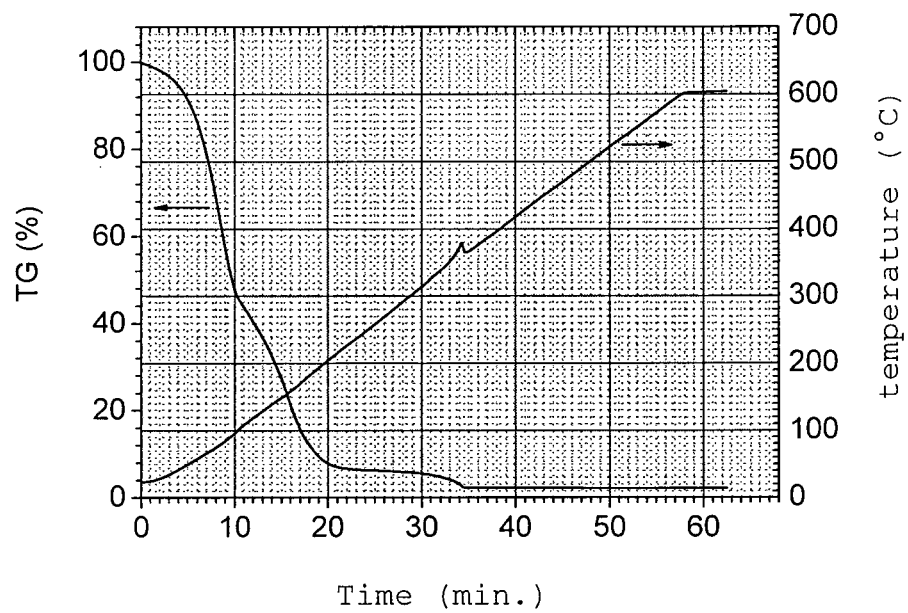
FIG. 9 shows charts of thermogravimetric analysis of the precursor composition according to the present invention (with a chelating agent) measured in Example 4.

Thermogravimetry (TG) charts measured under the following conditions for each of the compositions with La/Ru=0.9 (mol/mol) obtained above from Preparation Examples 5 and 7 (with a chelating agent (Preparation Example 7) and without a chelating agent (Preparation Example 5)) are shown in FIGS. 8 and 9.

[Conditions for Thermogravimetric Measurements]

Measurement instrument: "TG-DTA6200" from SII Nano Technology, Inc.

Feeding gas: air, at 300 mL/minute

Temperature range of measurement: 25 to 600° C.

Heating rate: 10° C./minute

Sample: a sample was prepared by transferring the composition for forming a conductive oxide film onto an aluminium pan for measurement as it is without removing a solvent.

Sample weight: about 15 mg was precisely weighed for use.

Rapid weight loss seen from the start of the measurement to around 140° C. in FIG. 8, and from the start of the measurement to around 200° C. in FIG. 9 represents solvent evaporation. As further increasing temperature, sample weight in each case was progressively decreased up to about 370° C. and then showed a constant value.

Example 5

In this Example, an element ratio of the oxide film formed was investigated.

The composition with La/Ru=0.9 (mol/mol) containing a chelating agent obtained above from Preparation Example 7 was spin coated on a 20 mm×20 mm silicon substrate having an oxide film on the surface at 2,000 rpm for 25 seconds. After that, heat was applied on a 370° C. hot plate for 5 minutes to obtain an oxide film. By repeating total 3 cycles of spin coating and heating to recoat a coated film on the substrate, an oxide film having a thickness of 100 nm was obtained on the substrate. For the oxide film, additional heating at 550° C. for 30 minutes was further performed under oxygen flow at a flow rate of 0.2 L (STP)/minute.

For the oxide film after this additional heating, elementary analysis was preformed on a Rutherford back scattering (RBS)/hydrogen forward scattering analysis (HFS)/nuclear reaction analysis (NRA) system ("Pelletron 2SDH" from National Electrostatics Corporation) to give an element ratio of La/Ru/O/C/H/Cl of 9.0/10.0/40.1/3.1/11.0/0.6 (a mole ratio).

As indicated above, a La/Ru ratio was obtained as expected from the mother composition. In addition, the formed film was shown to be a conductive film having a novel composition containing organic components other than oxides as it contains significant amount of C and H other than La, Ru and O. A trace amount of Cl appears to originate from impurities in the La precursor or the Ru precursor used.

From the element ratio of La/Ru/O, La and Ru appears to be trivalent and tetravalent, respectively (a theoretical composition ratio=$La_{0.9}RuO_{3.35}$).

<Preparation of the Composition for Forming a Conductive Oxide Film>

In the Preparation Examples and Comparative Preparation Examples below, the followings were used respectively: a commercial product (a 1.5 hydrate salt) from Kanto Chemicals Co., Inc. for lanthanum acetate; a commercial product (an anhydrous salt) from Alfa Aesar for ruthenium nitrosylacetate; a commercial product (a hexahydrate salt) from Wako Pure Chemical Industries, Ltd. for lanthanum nitrate; a commercial product (an anhydrous salt, the Ru content=31.3% by weight) from Alfa Aesar for ruthenium nitrosylnitrate; a commercial product (a heptahydrate salt, purity≥95%) from Kanto Chemicals, Co., Inc. for lanthanum chloride; a commercial product (a trihydrate salt) from Kanto Chemicals, Co., Inc. for ruthenium chloride.

Preparation Example 8

In a glass bottle having an internal capacity of 13.5 mL, 0.300 g lanthanum acetate 1.5 hydrate ($La(OOCCH_3)_3.1.5 H_2O$), 0.270 g of ruthenium nitrosylacetate ($Ru(NO)(OOCCH_3)_3$) and 4.43 g of propionic acid were mixed. To the mixture, 1.5 g of monoethanolamine was further slowly added dropwise with stirring at room temperature. Subsequently, the glass bottle was covered by a lid, and heated on a 150° C. hot plate for 40 minutes to obtain a solution. By allowing this solution to cool down to room temperature, and then diluting the resulting slightly viscous solution with 6.5 g of 1-butanol, prepared was a composition with a La/Ru ratio of 1.0 (mol/mol) having a concentration of 0.067 mol/kg for both La and Ru.

Preparation Example 9

In a glass bottle with a lid having an internal capacity of 13.5 mL, 0.3789 g of lanthanum nitrate hexahydrate ($La(NO_3)_3.6H_2O$), 0.2825 g of ruthenium nitrosylnitrate ($Ru(NO)(NO_3)_3$) and 4.339 g of 2-methoxyethanol were mixed and dissolved with stirring at room temperature to prepare a composition with a La/Ru ratio of 1.0 (mol/mol) having a concentration of 0.175 mol/kg for both La and Ru.

Comparative Preparation Example 1

In a glass bottle having an internal capacity of 13.5 mL, 0.342 g of lanthanum chloride heptahydrate ($LaCl_3.7H_2O$), 0.228 g of ruthenium chloride trihydrate ($RuCl_3.3H_2O$) and 4.43 g of propionic acid were mixed. To the mixture, 1.5 g of monoethanolamine was further slowly added dropwise with stirring at room temperature. Subsequently, this glass bottle was covered with a lid, and heated on a 150° C. hot plate for 1 hour with stirring to obtain a solution. By allowing this solution to cool down to room temperature, and then diluting the resulting slightly viscous solution with 6.5 g of 1-butanol, prepared was a composition with a La/Ru ratio of 1.0 (mol/mol) having a concentration of 0.067 mol/kg for both La and Ru.

Formation and Evaluation of the Conductive Oxide Film

Example 6

In this Example, the conductivity, crystallinity and surface smoothness of an oxide film formed with acetate and nitrosylacetate used as a lanthanoid salt and a ruthenium salt, respectively, were investigated.

The composition obtained above from Preparation Example 8 was spin coated on a 20 mm×20 mm silicon substrate having an oxide film on the surface at 2,000 rpm for 25 seconds. After that, heat was sequentially applied on a 150° C. hot plate for 6 seconds and then on a 250° C. hot plate for 1 minute, and heat was then further applied at 400° C. for 5 minutes to obtain an oxide film having a thickness of about 20 nm. A cycle of spin coating, sequential heating and additional heating was repeated total 3 times to obtain an oxide film having a thickness of about 60 nm. Volume resistivity was measured for the oxide film obtained here.

The oxide film after this measurement of volume resistivity was further subjected to additional heating at 500° C. for 10 minutes under oxygen flow at a flow rate of 0.2 L (STP)/minute. Volume resistivity and X ray diffraction were measured for the oxide film. In addition, root-mean-square roughness (RMS) as determined by atomic force microscopic observation was found to be only 0.3 nm, showing that this oxide film has a smoothness at the atomic level.

After these various measurements, the oxide film was further subjected to additional heating at 550° C. for 10 minutes under oxygen flow at a flow rate of 0.2 L (STP)/minute. Then volume resistivity and X ray diffractions were measured for the oxide film again.

Subsequently, the oxide film after the above re-measurements of volume resistivity and X ray diffraction was sequentially subjected to additional heating as described above at the following heating temperatures and durations: at 700° C. for 10 minutes, at 750° C. for 10 minutes, at 800° C. for 10 minutes and at 850° C. for 10 minutes. Then volume resistivity and X ray diffraction were measured after additional heating at each temperature.

Figure 10:
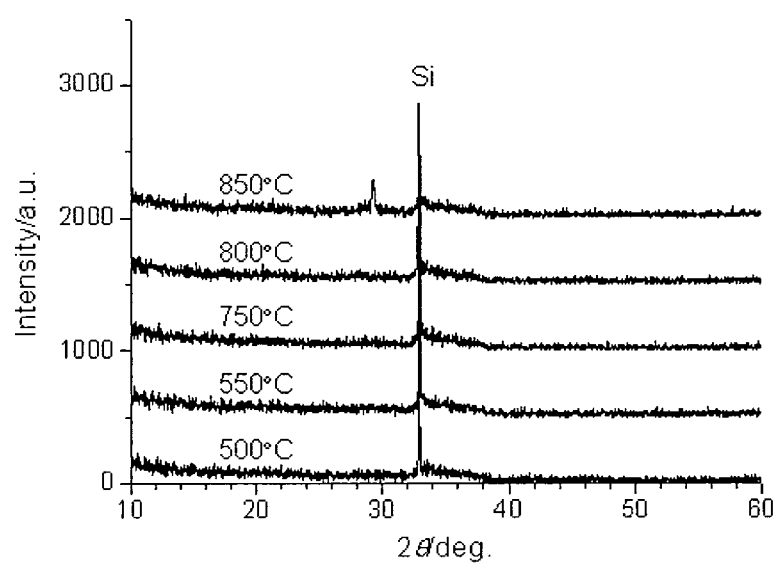
FIG. 10 shows X-ray diffraction charts of the oxide film after additional heating at each temperature formed in Example 6.
Figure 11:
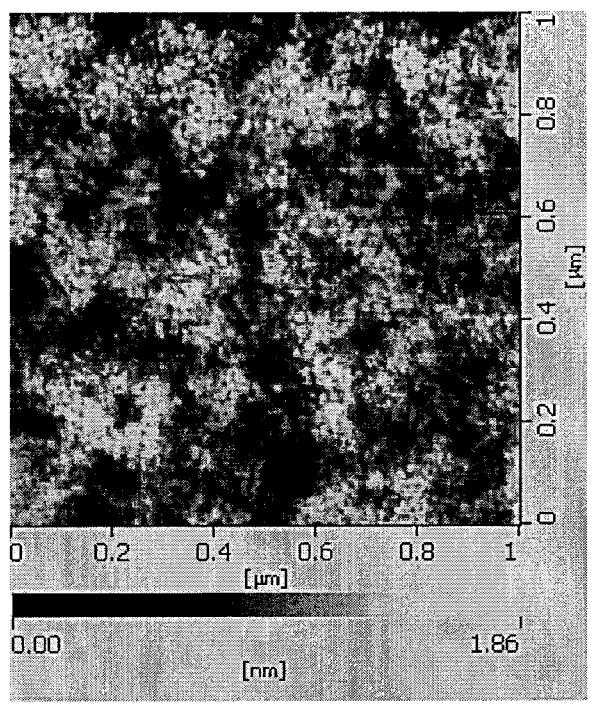
FIG. 11 shows an atomic force micrograph after additional heating at 500° C. taken in Example 6.

Values of volume resistivity measured above after additional heating between 500 and 800° C., and X ray diffraction charts after additional heating at 500° C., 550° C., 750° C., 800° C. and 850° C. are each shown in Table 3 and FIG. 10, respectively. In addition, an atomic force micrograph observed after additional heating at 500° C. is shown in FIG. 11. The results from the X ray charts and Table 3 below indicate that the oxide film formed from this composition stably remains amorphous up to 800° C., and shows high conductivity up to this temperature.

Example 7

In this Example, the conductivity of an oxide film formed with nitrate and nitrosylnitrate used as a lanthanoid salt and a ruthenium salt, respectively, was investigated.

The composition obtained above from Preparation Example 9 was spin coated on a 20 mm×20 mm silicon substrate having an oxide film on the surface at 2,000 rpm for 25 seconds. After that, heat was sequentially applied on a 150° C. hot plate for 6 seconds and on a 250° C. hot plate for 1 minute, and heat was then further applied at 400° C. for 5 minutes to obtain an oxide film. A cycle of spin coating, sequential heating and additional heating was repeated total 3 times to obtain an oxide film having a thickness of about 200 nm. Volume resistivity was measured for the oxide film obtained here.

The oxide film after the measurement of volume resistivity was further subjected to additional heating at 550° C. for 10 minutes under oxygen flow at a flow rate of 0.2 L (STP)/minute. Then volume resistivity was measured.

The oxide film after this measurement of volume resistivity was further subjected to additional heating at 700° C. for 10 minutes under oxygen flow at a flow rate of 0.2 L (STP)/minutes. Then volume resistivity was measured again.

Values of volume resistivity measured above are each shown in Table 3.

Comparative Example 1

In this Comparative Example, the conductivity of the oxide film formed with chlorides used as both a lanthanoid salt and a ruthenium salt.

The composition obtained above from Comparative Preparation Example 1 was spin coated on a 20 mm×20 mm silicon substrate having an oxide film on the surface at 2,000 rpm for 25 seconds. After that, heat was sequentially applied on a 150° C. hot plate for 6 seconds and on a 250° C. hot plate for 1 minute, and additional heating was then further performed at 370° C. for 5 minutes to obtain an oxide film having a thickness of 70 nm. The oxide film obtained here was further subjected to additional heating at 550° C. for 10 minutes under oxygen flow at a flow rate of 0.2 L (STP)/minute. Then volume resistivity was measured.

The oxide film after this measurement of volume resistivity was further subjected to additional heating at 700° C. for 10 minutes under oxygen flow at a flow rate of 0.2 L (STP)/minute. Then volume resistivity was measured again.

Values of volume resistivity measured above are each shown in Table 3.

TABLE 3

| | Volume resistivity of conductive oxide films ($\Omega \cdot cm$) | | | | | | |
|---|---|---|---|---|---|---|---|
| | Original oxide film | | Volume resistivity after additional heating | | | | |
| | Heating temperature | Volume resistivity | 500° C. | 550° C. | 700° C. | 750° C. | 800° C. |
| Example 6 | 400° C. | 0.050 | 0.021 | 0.017 | 0.019 | 0.028 | 0.038 |
| Example 7 | 400° C. | 0.0154 | — | 0.0146 | 0.0134 | — | — |
| Comparative Example 1 | 370° C. | 0.21 | — | 0.24 | 0.74 | — | — |

Preparation of the Compositions for Forming a Conductive Oxide Film

Preparation Examples 10 to 12

Compositions with a La/Ru mole ratio of 1.2, 1.4 and 1.6 (mol/mol) were each prepared in the same way as in Preparative Example 8 except that the amount of lanthanum acetate 1.5 hydrate used in Preparation Example 8 was changed to 0.360 g (Preparation Example 10), 0.420 g (Preparation Example 11) and 0.480 g (Preparation Example 12), respectively.

<Formation and Evaluation of the Conductive Oxide Films>

Example 8

In this Example, the conductivity of an oxide film having a La/Ru mole ratio greater than 1.0 was investigated.

Each of the compositions obtained above from Preparation Examples 10 to 12 was spin coated on a 20 mm×20 mm silicon substrate having an oxide film on the surface at 2,000 rpm for 25 seconds. After that, heat was sequentially applied on a 150° C. hot plate for 6 seconds, on a 250° C. hot plate for 1 minute, and then on a 400° C. hot plate for 6 seconds, and heat was then further applied at 450° C. for 5 minutes to obtain each oxide film. This cycle of spin coating, sequential heating and additional heating was repeated total 3 times to obtain oxide films having a thickness of 80 nm (La/Ru=1.2), 100 nm (La/Ru=1.4) and 120 nm (La/Ru=1.6), respectively.

Each of these oxide films was further subjected to additional heating at 550° C. for 30 minutes under oxygen flow at a flow rate of 0.2 L (STP)/minute. Volume resistivity and X ray diffraction were measured for these oxide films.

Figure 12:
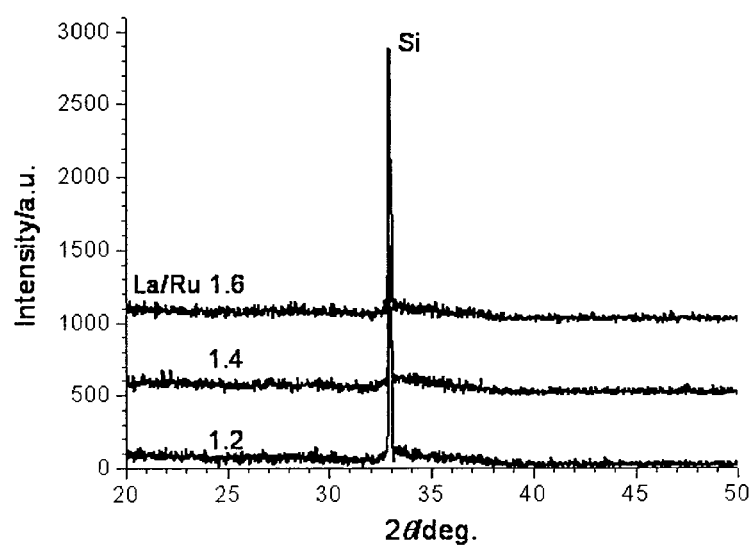
FIG. 12 shows X-ray diffraction charts of each of the oxide film formed in Example 8.

The results from the measurements of volume resistivity and the X ray diffraction charts are shown in Table 4 and FIG. 12, respectively.

TABLE 4

| Volume resistivity of the conductive oxide films | | | |
|---|---|---|---|
| La/Ru (a mole ratio) | 1.2 | 1.4 | 1.6 |
| volume resistivity (Ω · cm) | 0.044 | 0.15 | 0.66 |

Formation of a Patterned Conductive Oxide Film

Example 9

In this Example, a patterned conductive oxide film was formed by the nanoimprint method using the composition for forming a conductive oxide film of the present invention.

Experiments of the nanoimprinting were conducted using an experimental nanoimprinting apparatus equipped with a pressing device (a test model).

The experimental nanoimprinting apparatus equipped with a pressing device mainly comprises a base, a mold holder and two metal plates for press. The two metal plates for press, each of which comprises a heating unit and a temperature control unit, can heat the base, the mold holder and the like sandwiched by these plates up to 200° C. These two metal plates for press can press the base, the mold holder and the like sandwiched by these plates utilizing the principle of leverage, and indicate a value of pressure through a load cell.
[Examples of Nanoimprint Experiments]

"DURASURF HD-1100" was applied on a TEOS processed substrate mold (a mold for a test nanoimprinting, which has two or more line and space patterns with a different line width of 0.2 to 10 μm), which was then heated at 60° C. for 5 minutes to perform a mold release treatment.

The composition with a La/Ru ratio of 0.9 (mol/mol) containing a chelating agent obtained above from Preparation Example 7 was spin coated on a surface of a silicon wafer used as a substrate for transcription, at a rotation speed of 2,000 rpm and for a rotation time of 25 seconds. Subsequently, heat was applied at 150° C. for 6 seconds to form a coating.

The silicon wafer having the coating was placed on the experimental nanoimprinting apparatus equipped with a pressing device, and heated at 200° C. for 5 minutes with the TEOS processed substrate mold pressed against the coating at a pressure of 5 MPa. After cooling down, pressure was released, and the silicon wafer having a coating after pressurization and heating and the TEOS processed substrate mold were removed. Then the TEOS processed substrate mold was gently detached to obtain a pattern transferred from the pattern on the TEOS processed substrate mold. This pattern was further subjected to additional heating at 550° C. for 5 minutes under oxygen flow at a flow rate of 0.2 L (STP)/minute to give a patterned conductive oxide film.

Figure 13:
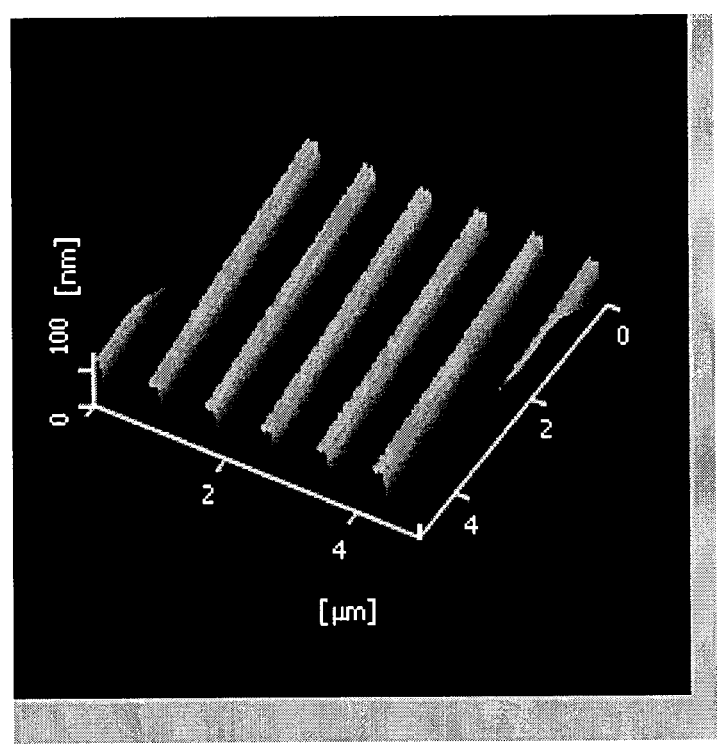
FIG. 13 shows an atomic force micrograph of printing pattern taken in Example 9.

Atomic force microscopic observations showed a good transfer on the patterned conductive oxide film. An atomic force micrograph taken at this time is shown in FIG. 13. This micrograph indicates that the line and space pattern having a line width of about 0.2 μm is formed with good transferability.

In this case, one of the significant advantages of the present invention is that the pattern does not show any distortions or deformations associated with crystallization even after additional heating, showing that good transferability is maintained. In other words, because the conductive oxide film according to the present invention stably remains amorphous without undergoing crystallization even after heated at high temperature, a patterned conductive oxide film can be easily formed on which a fine pattern is precisely transferred without any distortions or deformations associated with crystallization and without limited by a crystal size.

Furthermore, the patterned conductive oxide film according to the present invention shows excellent shape stability and maintains high conductivity over every manufacturing step of electronic devices which requires annealing of chips because it does not undergo crystallization even by heating after formation, and does not show any distortions and deformations.

Preparation of the Compositions for Forming a Conductive Oxide Film

Preparation Examples 13 to 27

Into a glass bottle having a capacity of 13.5 mL, each oxide precursor compound and propionic acid were charged in an amount shown in Table 5, respectively. To this, 0.75 g of monoethanolamine (MEA) was slowly added dropwise with stirring the content of the glass bottle at room temperature. Subsequently, the glass bottle was sealed with a stopper, and heated on a hot plate set at a temperature of 150° C. while stirring the content, for 40 minutes in the case of Preparation Examples 13 to 25, and for 2 hours in the case of Preparation Examples 26 and 27, respectively, to dissolve oxide precursor compounds. A slightly viscous solution was obtained. By diluting this solution with 3.25 g of 1-butanol, a solution containing metal elements in a total concentration of 0.135 mol/kg was obtained, which was taken as a composition for forming a conductive oxide film.

The abbreviation of each oxide precursor compound in Table 5 is as follows.

La-ac: lanthanum acetate 1.5 hydrate (99.99%, Kanto Chemicals, Co., Inc.),

Ce-ac: cerium acetate (III) monohydrate (99.99%, Kanto Chemicals, Co., Inc.),

Pr-ac: praseodymium acetate (III) hydrate (99.9%, Wako Pure Chem Industries, Ltd.), Nd-ac: neodymium acetate monohydrate (99.9%, Wako Pure Chem Industries, Ltd.), Sm-ac: samarium acetate tetrahydrate (99.9%, Wako Pure Chem Industries, Ltd.), Eu-ac: europium acetate (III) hydrate (99.9%, Wako Pure Chem Industries, Ltd.), Gd-ac: gadolinium acetate (III) hydrate (99.9%, Aldrich), Tb-ac: terbium acetate (III) tetrahydrates (99.9%, Wako Pure Chem Industries, Ltd.), Dy-ac: dysprosium acetate tetrahydrate (99.9%, Wako Pure Chem Industries, Ltd.), Ho-ac: holmium acetate tetrahydrate (99.9%, Wako Pure Chem Industries, Ltd.), Er-ac: erbium acetate tetrahydrate (99.9%, Wako Pure Chem Industries, Ltd.), Tm-ac: thulium acetate tetrahydrate (99.9%, Wako Pure Chem Industries, Ltd.), Yb-ac: ytterbium acetate (III) tetrahydrate (99.9%, Aldrich), Lu-ac: lutetium acetate tetrahydrate (99.9%, Wako Pure Chem Industries, Ltd.), Ru-noac: ruthenium nitrosylacetate (III) anhydrite (99.99%, Alfa Aesar)

Ir-ac: iridium acetate (III) anhydrite (Ir content=about 48%, ChemPur GmbH), and Rh-ac: rhodium acetate anhydrite (Rh content=35 to 40%, ChemPur GmbH).

TABLE 5

Preparation of the compositions for forming a conductive oxide

| | Oxide precursor compounds | | | Amount of |
|---|---|---|---|---|
| | Compound (1) | | Compound (2) | | Propionic |
| | Type | Amount (g) | Type | Amount (g) | acid (g) |
| Preparation Example 13 | Ce-ac | 0.147 | Ru-noac | 0.135 | 2.218 |
| Preparation Example 14 | Pr-ac | 0.155 | Ru-noac | 0.135 | 2.210 |
| Preparation Example 15 | Nd-ac | 0.148 | Ru-noac | 0.135 | 2.217 |
| Preparation Example 16 | Sm-ac | 0.175 | Ru-noac | 0.135 | 2.190 |
| Preparation Example 17 | Eu-ac | 0.160 | Ru-noac | 0.135 | 2.205 |
| Preparation Example 18 | Gd-ac | 0.154 | Ru-noac | 0.135 | 2.210 |
| Preparation Example 19 | Tb-ac | 0.179 | Ru-noac | 0.135 | 2.186 |
| Preparation Example 20 | Dy-ac | 0.180 | Ru-noac | 0.135 | 2.185 |
| Preparation Example 21 | Ho-ac | 0.181 | Ru-noac | 0.135 | 2.184 |
| Preparation Example 22 | Er-ac | 0.182 | Ru-noac | 0.135 | 2.183 |
| Preparation Example 23 | Tm-ac | 0.183 | Ru-noac | 0.135 | 2.182 |
| Preparation Example 24 | Yb-ac | 0.185 | Ru-noac | 0.135 | 2.180 |
| Preparation Example 25 | Lu-ac | 0.186 | Ru-noac | 0.135 | 2.179 |
| Preparation Example 26 | La-ac | 0.150 | Ir-ac | 0.172 | 2.178 |
| Preparation Example 27 | La-ac | 0.150 | Rh-ac | 0.118 | 2.232 |

Formation and Evaluation of the Conductive Oxide Films

Example 10

In this Example, the effects of metal elements other than lanthanum used as a lanthanoid in the lanthanoid-ruthenium oxide film were investigated.

Each of the compositions obtained above from Preparation Examples 13 to 25 was spin coated on a 20 mm×20 mm silicon substrate having an oxide film on the surface at 2,000 rpm for 25 seconds. After that, heat was sequentially applied on a 150° C. hot plate for 6 seconds and on a 250° C. hot plate for 1 minute, and heat was then further applied at 400° C. for 5 minutes to obtain an oxide film having a thickness of about 20 nm. A cycle of spin coating, sequential heating and additional heating was repeated total 3 times to obtain an oxide film having a thickness of about 60 nm. Volume resistivity was measured for each of the oxide films obtained here.

The oxide films after the measurement of volume resistivity were further subjected to additional heating at 500° C. for 10 minutes under oxygen flow at a flow rate of 0.2 L (STP)/minute. Then volume resistivity was measured again. Furthermore, the oxide films after the above re-measurement of volume resistivity were sequentially subjected to additional heating as described above at the following heating temperatures and durations: at 550° C. for 10 minutes and at 650° C. for 10 minutes. Then volume resistivity was each measured after additional heating at each temperature.

X ray diffraction was measured for each of the oxide films after additional heating at 650° C. In addition to these, X ray diffraction was also measured after additional heating at 550° C. for the experiment example in which cerium was used as a lanthanoid.

Figure 14:
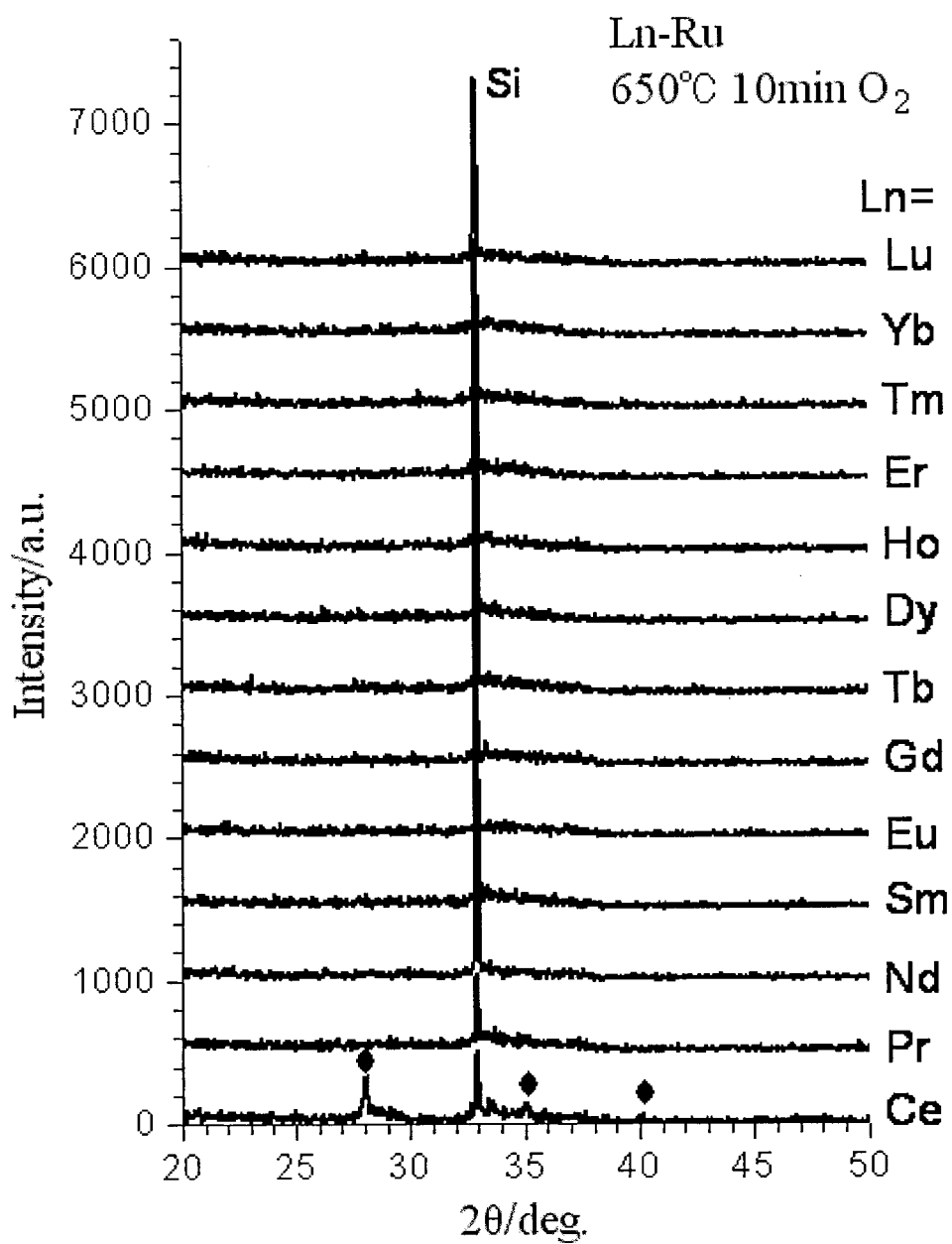
FIG. 14 shows X-ray diffraction charts of each of the oxide film formed in Example 10.
Figure 15:
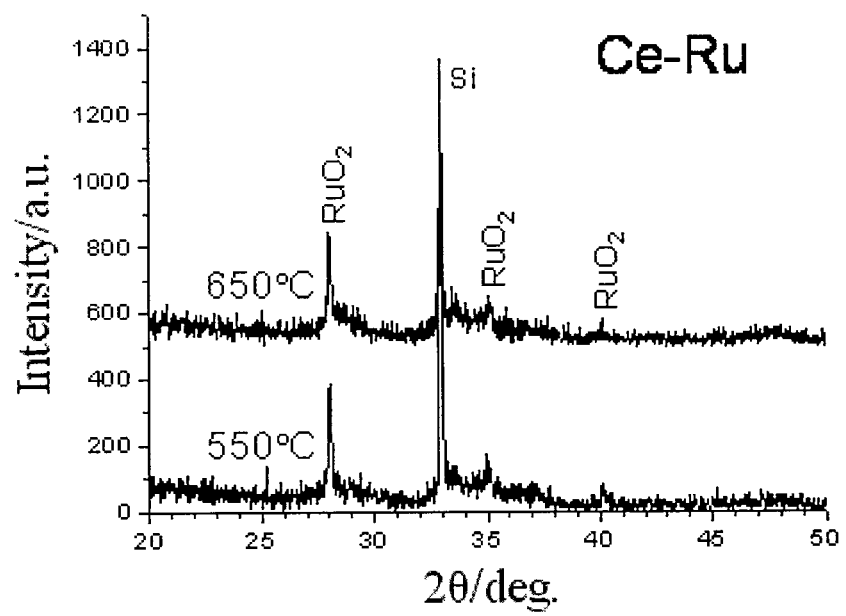
FIG. 15 shows X-ray diffraction charts of the Ce—Ru oxide film formed in Example 10.

Each of the values of volume resistivity measured above and the X ray diffraction charts after additional heating at 650° C. are shown in Table 6 and FIG. 14, respectively. In addition, the X ray diffraction charts after additional heating at 550° C. and at 650° C. are shown in FIG. 15 for the experiment example in which cerium was used as a lanthanoid.

TABLE 6

Volume resistivity of Ln-Ru oxide films ($\Omega \cdot cm$)

| | | Type of Ln | | | | | | | | | | | |
|---|---|---|---|---|---|---|---|---|---|---|---|---|---|
| | | Ce | Pr | Nd | Sm | Eu | Gd | Tb | Dy | Ho | Er | Tm | Yb | Lu |
| Heating temperature | 400° C. | 2.3 | 0.026 | 0.031 | 0.032 | 0.019 | 0.017 | 0.025 | 0.042 | 0.055 | 0.072 | 0.060 | 0.042 | 0.066 |
| | 500° C. | o.l. | 0.014 | 0.019 | 0.019 | 0.016 | 0.018 | 0.024 | 0.044 | 0.066 | 0.14 | 0.21 | 0.24 | 0.37 |
| | 550° C. | o.l. | 0.017 | 0.014 | 0.020 | 0.015 | 0.020 | 0.033 | 0.052 | 0.066 | 0.12 | 0.21 | 0.35 | 0.84 |
| | 650° C. | o.l. | 0.012 | 0.018 | 0.019 | 0.036 | 0.050 | 0.066 | 0.13 | 0.20 | 0.47 | 0.90 | 1.32 | 3.36 |

*o.l. = overload

The results from these experiments indicate that ruthenium oxide ($RuO_2$) also undergoes crystallization after additional heating at 550° C., showing a large value of volume resistivity in the case that cerium was used as a lanthanoid.

In contrast, the results indicate that it does not undergo crystallization even after additional heating at 650° C., showing a small value of volume resistivity in the case that lanthanoids other than cerium were used. In particular, the volume resistivity is small in the case that a lanthanoid was praseodymium, neodymium, samarium, europium, or gadolinium.

Example 11

In this Example, the effects of iridium or rhodium used in a lanthanoid-ruthenium oxide film instead of ruthenium were investigated.

A composition was spin coated on a silicon substrate having an oxide film on the surface in the same way as in Example 10 except that each of the compositions obtained above from Preparation Examples 26 and 27 were used. After that, a cycle of sequential heating at 150° C., 250° C. and 400° C. was repeated three times to obtain an oxide film having a thickness of about 60 nm. Volume resistivity was measured for the oxide films obtained here.

The oxide films after the measurement of volume resistivity were further subjected to sequential additional heating under oxygen flow at a flow rate of 0.2 L (STP)/minute using the following conditions: for a lanthanum-iridium oxide film, at 500° C. for 30 minutes, at 550° C. for 30 minutes, at 600° C. for 10 minutes and at 650° C. for 10 minutes; for a lanthanum-rhodium oxide film, at 500° C. for 10 minutes, at 600° C. for 10 minutes, at 700° C. for 10 minutes, at 800° C. for 10 minutes and at 850° C. for 5 minutes, respectively. In each case, volume resistivity was measured for the oxide films after additional heating at a temperature of 700° C. or below.

In addition, in the case of the lanthanum-iridium oxide film, X ray diffraction was measured for the oxide film after additional heating at 500° C. and 650° C. In the case of the lanthanum-rhodium oxide film, X ray diffraction was measured for the oxide film before additional heating (after heating at 400° C.) and after additional heating at each temperature.

Figure 16:
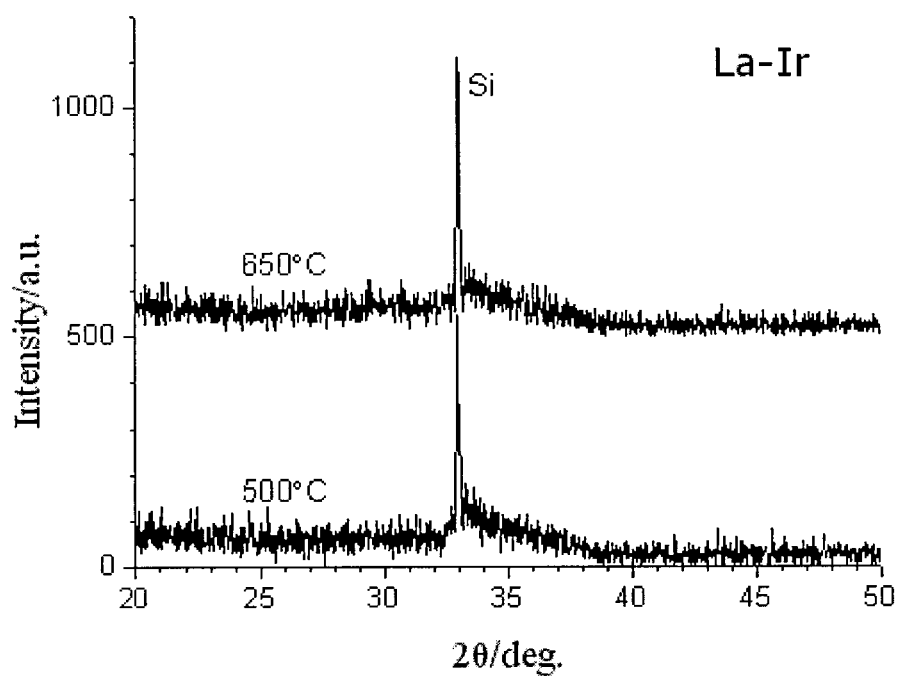
FIG. 16 shows X-ray diffraction charts of the La—Ir oxide film formed in Example 11.
Figure 17:
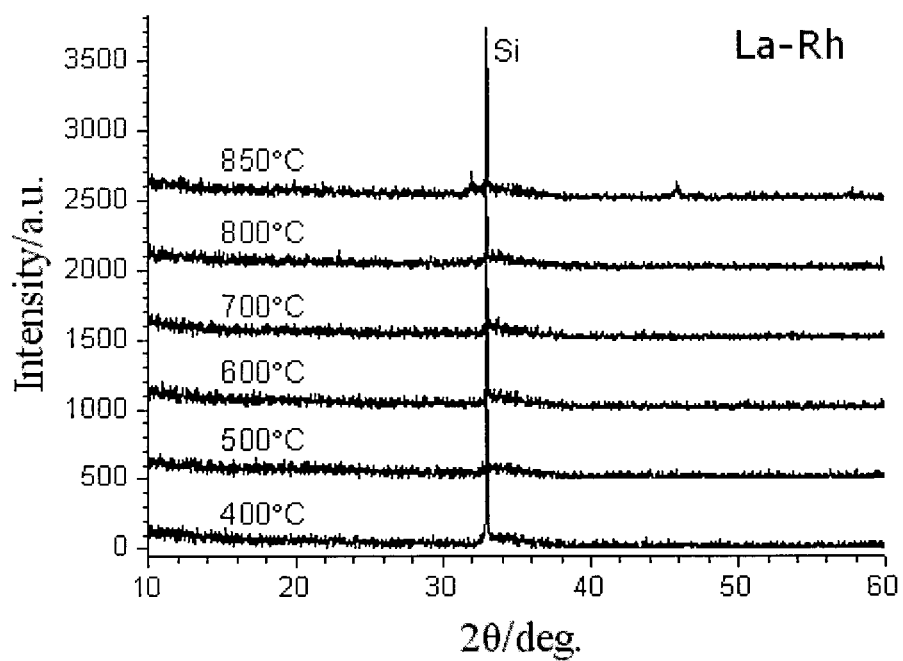
FIG. 17 shows X-ray diffraction charts of the La—Rh oxide film formed in Example 11.

Each of the values of volume resistivity measured above, the X ray diffraction charts of the lanthanum-iridium oxide film and the X ray diffraction charts of the lanthanum-rhodium oxide film are shown in Table 7, FIG. 16 and FIG. 17, respectively.

TABLE 7

Volume resistivity of La—X oxide films ($\Omega \cdot m$)

| Heating temperature | La—Ir | La—Rh |
|---|---|---|
| 400° C. | 0.096 | 2.2 |
| 500° C. | 0.028 | 0.38 |
| 550° C. | 0.021 | — |
| 600° C. | 0.022 | 0.19 |
| 650° C. | 0.022 | — |
| 700° C. | — | 0.10 |

As shown in Table 7, the lanthanum-iridium oxide film was found to show the volume resistivity in the order of $10^{-2}$ $\Omega \cdot cm$. The lanthanum-rhodium oxide film showed the volume resistivity in the order of $10^{-1}$ $\Omega \cdot cm$ when heated at a temperature of 500° C. or higher. In addition, the lanthanum-rhodium oxide film was found to remain amorphous even after heated up to 800° C. (FIG. 17).

The Semiconductivity, Element Ratio and Career Type of the Conductive Oxide Film Example 12

In this Example, whether a lanthanum-ruthenium oxide film showed semiconductivity was investigated.

A cycle of spin coating on a substrate in the same way as in Example 6 except that the composition prepared in the same way as in Preparation Examples 8 above (a La/Ru ratio was 1.0 (mol/mol), and the concentrations of La and Ru were both 0.067 mol/Kg) was used, and the substrate was a quartz glass substrate, and a sequential heating at 150° C., 250° C. and 400° C. was repeated 5 times to obtain an oxide film having a thickness of about 100 nm. Then, additional heating at 500° C. for 10 minutes under oxygen flow at a flow rate of 0.2 L (STP)/minute was performed to obtain an oxide film of a heating temperature of 500° C.

Additional heating was performed in the same way as in the above except that a temperature of additional heating was 650° C. to obtain another oxide film of a heating temperature of 650° C.

The temperature dependence of specific resistance $\rho$ was investigated for these two oxide films using an instrument to measure physical properties (PPMS, Quantum Design, Inc., USA). A specific resistance-temperature curve obtained is shown in FIG. 18.

Figure 18:
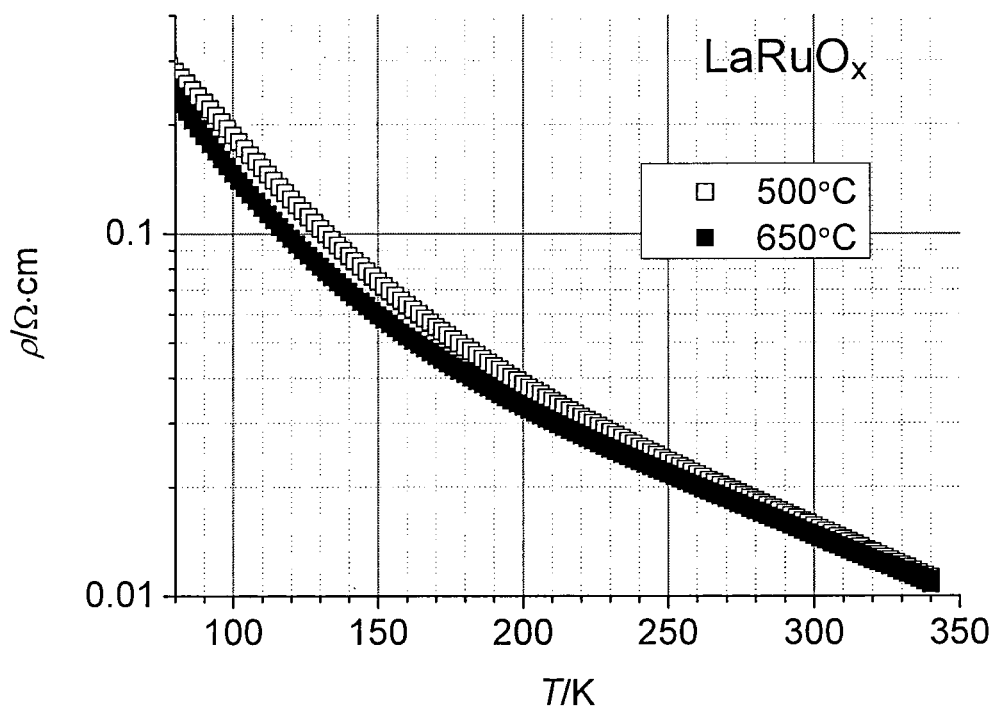
FIG. 18 shows specific resistance-temperature curves of the La—Ru oxide film formed in Example 12.

As shown in FIG. 18, the specific resistance decreases as temperature increases. The results demonstrate that the lanthanum-ruthenium oxide film is a semiconductor.

Example 13

A film was formed in the same way as in Example 12 where the oxide film of a heating temperature of 650° C. was formed except that a silicon wafer having an oxide film on the surface was used as a substrate. Elementary analysis was performed for the film using the same RBS/HFS/NRA system as in Example 5. The results showed that the element ratio of La/Ru/O/C/H/Cl was 9.9/10.0/37.8/2.7/0.0/0.2 (a mole ratio).

A La/Ru ratio was obtained almost as expected from the mother composition. In addition, the film formed was found to be a conductive film having a novel composition containing a residual organic component in addition to oxides because it contained a significant amount of C in addition to La, Ru and O. A trace amount of Cl appears to originate from impurities in the La precursor or the Ru precursor used.

The element ratio of La/Ru/O suggests that La is trivalent and Ru is tetravalence (a theoretical composition rate=$LaRuO_{3.5}$).

Example 14

In this Example, a career type in a lanthanum-ruthenium oxide film was investigated.

Two lanthanum-ruthenium oxide films of a heating temperature of 500° C. and 650° C. respectively were obtained in the same way as in Example 12 except that a duration of additional heating was 30 minutes for both. For these oxide films, a Seebeck coefficient at room temperature was investigated using an instrument to measure the Hall effect and specific resistance (Product name "ResiTest 8300" from TOYO Corporation).

The Seebeck coefficient was +9.05 μV/K when a heating temperature was 500° C., and +7.98 μV/K when a heating temperature was 650° C., which were both positive, showing that these oxide films have p-type semiconductivity.

Example 15

In this Example, a career type in the lanthanum-iridium oxide film was investigated.

A lanthanum-iridium oxide film of a heating temperature of 500° C. was obtained in the same way as in the case of additional heating temperature of 500° C. in Example 14 using a composition (La—Ir) prepared as described in Preparation Example 26.

When examined as described in Example 14, the Seebeck coefficient of this oxide film was a positive value of +4.92 μV/K, showing that it has p-type semiconductivity.

The results from Examples 14 and 15 are summarized in Table 8.

TABLE 8

The career type of the oxide films

| Oxide film | Heating temperature (° C.) | Seebeck coefficient (μV/K) | Career Type |
| --- | --- | --- | --- |
| La—Ru | 500 | +9.05 | p type |
|  | 650 | +7.98 | p type |
| La—Ir | 500 | +4.62 | p type |

EFFECTS OF THE INVENTION

According to the present invention, provided are a precursor composition and a method for forming a conductive oxide film having high conductivity and a stable amorphous structure maintained even after heated at high temperature by a simple liquid phase process.

A conductive oxide film formed from the precursor composition of the present invention has a stable amorphous structure, and does not undergo crystallization even after heated at high temperature. Therefore even when it is used for electronic device which requires high temperature heating in the manufacturing steps, a fine electrode, wiring and the like can be easily formed without limited by a crystal size.

In addition, the conductive oxide film formed from the precursor composition of the present invention shows good semiconductivity and p type conductivity. Therefore, by using the precursor composition of the present invention together with other coating-type precursor compositions for forming a compound semiconductor film, a practical semiconductor device can be manufactured by a simple process of a liquid phase process alone.

The invention claimed is:

1. A composition comprising:
    at least one selected from the group consisting of carboxylates, nitrates and sulfates of lanthanoids except for cerium,
    at least one selected from the group consisting of carboxylates, nitrosyl carboxylates, nitrosyl nitrates and nitrosyl sulfates of ruthenium, iridium or rhodium, and
    a solvent comprising at least one selected from the group consisting of carboxylic acids, alcohols and ketones,
    wherein a ratio ($N_A/N_B$) of a number of atoms of the lanthanoid ($N_A$) and a number of atoms of ruthenium, iridium or rhodium ($N_B$) in the composition is 0.6 to 2.0.

2. The composition according to claim 1, wherein the solvent is a non-aqueous solvent.

3. The composition according to claim 1 or 2, wherein the ratio ($N_A/N_B$) of a number of atoms of the lanthanoid ($N_A$) and a number of atoms of ruthenium, iridium or rhodium ($N_B$) in the composition is 0.7 to 1.5.

4. The composition according to claim 1 or 2, wherein the lanthanoid is at least one selected from the group consisting of lanthanum, praseodymium, neodymium, samarium, europium and gadolinium.

5. A method of forming an amorphous conductive oxide film, comprising applying the composition according to claim 1 or 2 on a substrate to form a coated film, and heating the coated film under an oxidizing atmosphere.

6. An amorphous conductive oxide film formed by the method according to claim 5.

7. The amorphous conductive oxide film according to claim 6, which has p-type semiconductivity.

8. A method of forming a patterned amorphous conductive oxide film, comprising:
    applying the composition according to claim 1 or 2 on a substrate to form a coated film,
    placing a patterned mold on the coated film such that the coated film is sandwiched between the substrate and the patterned mold, and
    heating the coated film under an oxidizing atmosphere.

9. A patterned amorphous conductive oxide film formed by the method according to claim 8.

10. The patterned amorphous conductive oxide film according to claim 9, which has p-type semiconductivity.

11. The composition according to claim 1 or 2, wherein the ratio ($N_A/N_B$) of a number of atoms of the lanthanoid ($N_A$) and a number of atoms of ruthenium, iridium or rhodium ($N_B$) in the composition is 0.8 to 1.3.

* * * * *